(12) United States Patent
Little

(10) Patent No.: US 11,025,013 B2
(45) Date of Patent: Jun. 1, 2021

(54) DUAL-SIDED RECEPTACLE CONNECTOR

(71) Applicants: FOXCONN (KUNSHAN) COMPUTER CONNECTOR CO., LTD., Kunshan (CN); FOXCONN INTERCONNECT TECHNOLOGY LIMITED, Grand Cayman (KY)

(72) Inventor: Terrance F. Little, Fullerton, CA (US)

(73) Assignees: FOXCONN (KUNSHAN) COMPUTER CONNECTOR CO., LTD., Kunshan (CN); FOXCONN INTERCONNECT TECHNOLOGY LIMITED, Grand Cayman (KY)

(*) Notice: Subject to any disclaimer, the term of this patent is extended or adjusted under 35 U.S.C. 154(b) by 27 days.

(21) Appl. No.: 16/186,487

(22) Filed: Nov. 10, 2018

(65) Prior Publication Data

US 2019/0157810 A1 May 23, 2019

Related U.S. Application Data

(60) Provisional application No. 62/584,751, filed on Nov. 11, 2017.

(51) Int. Cl.
  *H01R 24/00* (2011.01)
  *H01R 13/6583* (2011.01)
  (Continued)

(52) U.S. Cl.
  CPC ....... *H01R 13/6583* (2013.01); *H01R 9/0512* (2013.01); *H01R 9/0515* (2013.01); *H01R 12/72* (2013.01); *H01R 12/724* (2013.01); *H01R 12/75* (2013.01); *H01R 13/514* (2013.01); *H01R 13/659* (2013.01); *H01R 13/6587* (2013.01); *H01R 13/6592* (2013.01); *H01R 24/60* (2013.01); *H05K 5/00* (2013.01)

(58) Field of Classification Search
  CPC ................ H01R 12/724; H01R 13/514; H01R 13/6592; H01R 24/542; H01R 13/6583; H01R 13/659; H01R 13/6587; H01R 9/0515; H01R 12/75; H01R 12/72; H01R 24/60; H01R 9/0512; H05K 5/00;
  (Continued)

(56) References Cited

U.S. PATENT DOCUMENTS 4,264,114 A * 4/1981 Chandler ............. H01R 12/724
                                                          439/62
4,764,130 A * 8/1988 DiClemente ......... H01R 13/506
                                                          439/686

(Continued)

*Primary Examiner* — Abdullah A Riyami
*Assistant Examiner* — Nelson R. Burgos-Guntin
(74) *Attorney, Agent, or Firm* — Ming Chieh Chang; Wei Te Chung

(57) ABSTRACT

The first type adaptor cable assembly has an inner connector equipped with a plug board derived from the FP5 for mating with the FP5 vertical receptacle connector, and an outer connector configured to be in compliance with the FP5 or QSFP-DD receptacle connector and disposed at a rear end of the cage for mating with the FP5 or QSFP-DD inserted into the cage. Notably, the connection between the inserted FP5 and QSFP-DD and the corresponding FP5 or QSFP-DD receptacle connector directly attached/linked to the adaptor cable, is same with the traditional connection between the inserted FP5 or QSFP-DD and the corresponding receptacle connector which is only mounted to the main/external printed circuit board without directly attachment to the cable.

11 Claims, 41 Drawing Sheets

(51) Int. Cl.
*H01R 13/659* (2011.01)
*H01R 13/6592* (2011.01)
*H01R 13/6587* (2011.01)
*H01R 9/05* (2006.01)
*H01R 12/75* (2011.01)
*H01R 12/72* (2011.01)
*H01R 24/60* (2011.01)
*H01R 13/514* (2006.01)
*H05K 5/00* (2006.01)

(58) Field of Classification Search
CPC ...... G02B 6/4277; G02B 6/43; G02B 6/4292; G02B 6/3897; G02B 6/4249
USPC .................................................... 439/607.07
See application file for complete search history.

(56) References Cited

U.S. PATENT DOCUMENTS

| | | | |
|---|---|---|---|
| 5,007,858 A * | 4/1991 | Daly | H01R 23/661 439/498 |
| 7,744,416 B2 | 6/2010 | Hon Hai | |
| 8,845,364 B2 | 9/2014 | Molex | |
| 8,944,830 B2 * | 2/2015 | Little | G02B 6/4292 439/79 |
| 9,011,177 B2 | 4/2015 | Molex | |
| 9,553,381 B2 | 1/2017 | Molex | |
| 9,590,366 B1 | 3/2017 | Tyco | |
| 9,705,258 B2 * | 7/2017 | Phillips | H01R 13/74 |
| 9,806,466 B2 * | 10/2017 | Liao | H01R 13/6586 |
| 9,806,468 B2 * | 10/2017 | Liao | H01R 12/721 |
| 10,403,565 B1 * | 9/2019 | Henry | H01L 23/49517 |
| 10,530,081 B1 * | 1/2020 | Costello | H01R 12/585 |
| 10,574,002 B1 * | 2/2020 | Henry | H01R 13/6587 |
| 10,581,201 B2 * | 3/2020 | Hsu | H01R 13/405 |
| 10,651,606 B2 * | 5/2020 | Little | H01R 13/6587 |
| 2006/0166551 A1 * | 7/2006 | Korsunsky | H01R 12/727 439/541 |
| 2011/0223805 A1 * | 9/2011 | Regnier | H01R 13/506 439/607.01 |
| 2016/0211593 A1 * | 7/2016 | Tsai | H01R 13/6658 |
| 2016/0218455 A1 * | 7/2016 | Sayre | H01R 13/6594 |
| 2017/0077643 A1 | 3/2017 | Samtec | |
| 2018/0006416 A1 | 1/2018 | Molex | |
| 2018/0034175 A1 | 2/2018 | Molex | |
| 2018/0090887 A1 * | 3/2018 | Little | H01R 13/6594 |
| 2019/0020152 A1 * | 1/2019 | Little | H01R 13/6587 |
| 2019/0157810 A1 * | 5/2019 | Little | H01R 9/0515 |

* cited by examiner

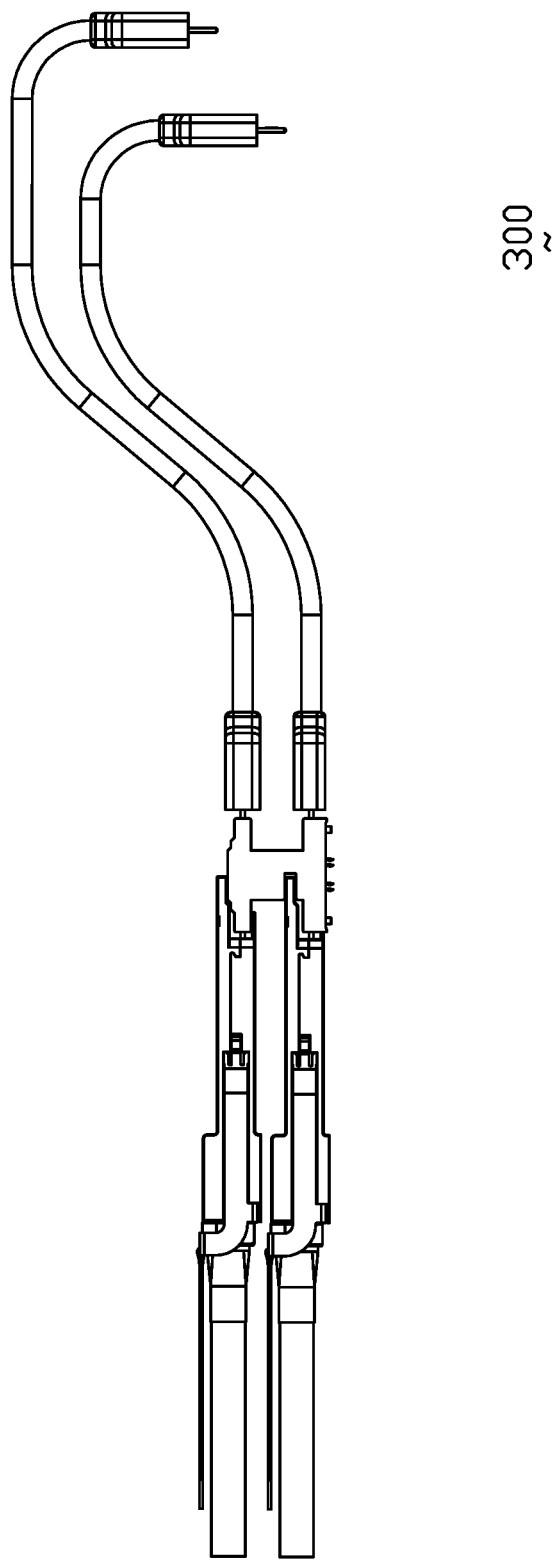

350

DUAL-SIDED RECEPTACLE CONNECTOR

BACKGROUND OF THE INVENTION

1. Field of the Invention

The present invention relates to an electrical connector assembly, especially to the electrical connection with the external pluggable module via a dual-sided receptacle connector or a directly attached receptacle connector linked to an adaptor cable assembly by following the spirit of the previous designs of which the provisional applications have a Ser. No. 62/367,098 filed on Jul. 26, 2016, 62/399,272 filed on Sep. 23, 2016, 62/412,841 filed on Oct. 26, 2016, 62/425,627 filed on Nov. 23, 2016, 62/449,133 filed on Jan. 23, 2017, 62/509,141 filed on May 21, 2017, 62/522,113 filed on Jun. 20, 2017, and 62/533,131 filed on Jul. 17, 2017.

2. Description of Related Art

The traditional design used for connecting two sub-systems respectively on two printed circuit boards, discloses a linking cable with at one end a LEC plug connector mated to a receptacle connector embedded in the ASIC, and at the other end two port IFP plug connectors mated to on one side the so-called Interposer with IFT receptacle connector, and the other side thereof further configured with two ports of QSFP-28.

A standardized mechanisms are expected to be used to place the above-mentioned structures.

SUMMARY OF THE INVENTION

Two approaches are arranged for achieving the above-mentioned connection in the invention.

To achieve the above-mentioned object, an adaptor cable is used to connect between, on one end, the FP5 vertical receptacle connector which is on an inner side of the printed circuit board and closer to the ASIC, and, on the other end, an FP5 or a QSFP-DD which is inserted into the corresponding cage on an outer side of the printed circuit board. The first type adaptor cable assembly has an inner connector equipped with a plug board derived from the FP5 for mating with the FP5 vertical receptacle connector, and an outer connector configured to be in compliance with the FP5 or QSFP-DD receptacle connector and disposed at a rear end of the cage for mating with the FP5 or QSFP-DD inserted into the cage. Notably, the connection between the inserted FP5 and QSFP-DD and the corresponding FP5 or QSFP-DD receptacle connector directly attached/linked to the adaptor cable, is same with the traditional connection between the inserted FP5 or QSFP-DD and the corresponding receptacle connector which is only mounted to the main/external printed circuit board without directly attachment to the cable.

The second type adaptor cable assembly has the inner connector same with that of the first type adaptor cable assembly, and the outer connector equipped with a plug board derived from the QSFP-DD for mating within an inner side port of a dual-sided QSFP-DD receptacle connector or a so-called extender or adaptor which is placed at the rear end of the cage to replace the traditional one sided receptacle connector.

Notably, the contacts of either the directly attached receptacle connector in the first type adaptor cable or the dual-sided receptacle connector with direct attachment to the adaptor cable, essentially are essentially not directly mounted upon the printed circuit board but either directly or indirectly connected to the adaptor cable optionally except the so-called side-band signal contacts located at the center region thereof. Understandably, in the invention the adaptor or fly-over cable are used to replace the connection via the circuit traces on the printed circuit board for better electrical characteristics during high speed transmission.

Other objects, advantages and novel features of the invention will become more apparent from the following detailed description when taken in conjunction with the accompanying drawings.

BRIEF DESCRIPTION OF THE DRAWINGS

FIG. 16(B) is a side view of the electrical system of FIG. 16(A);

DETAILED DESCRIPTION OF THE PREFERRED EMBODIMENT

Figure 1A:
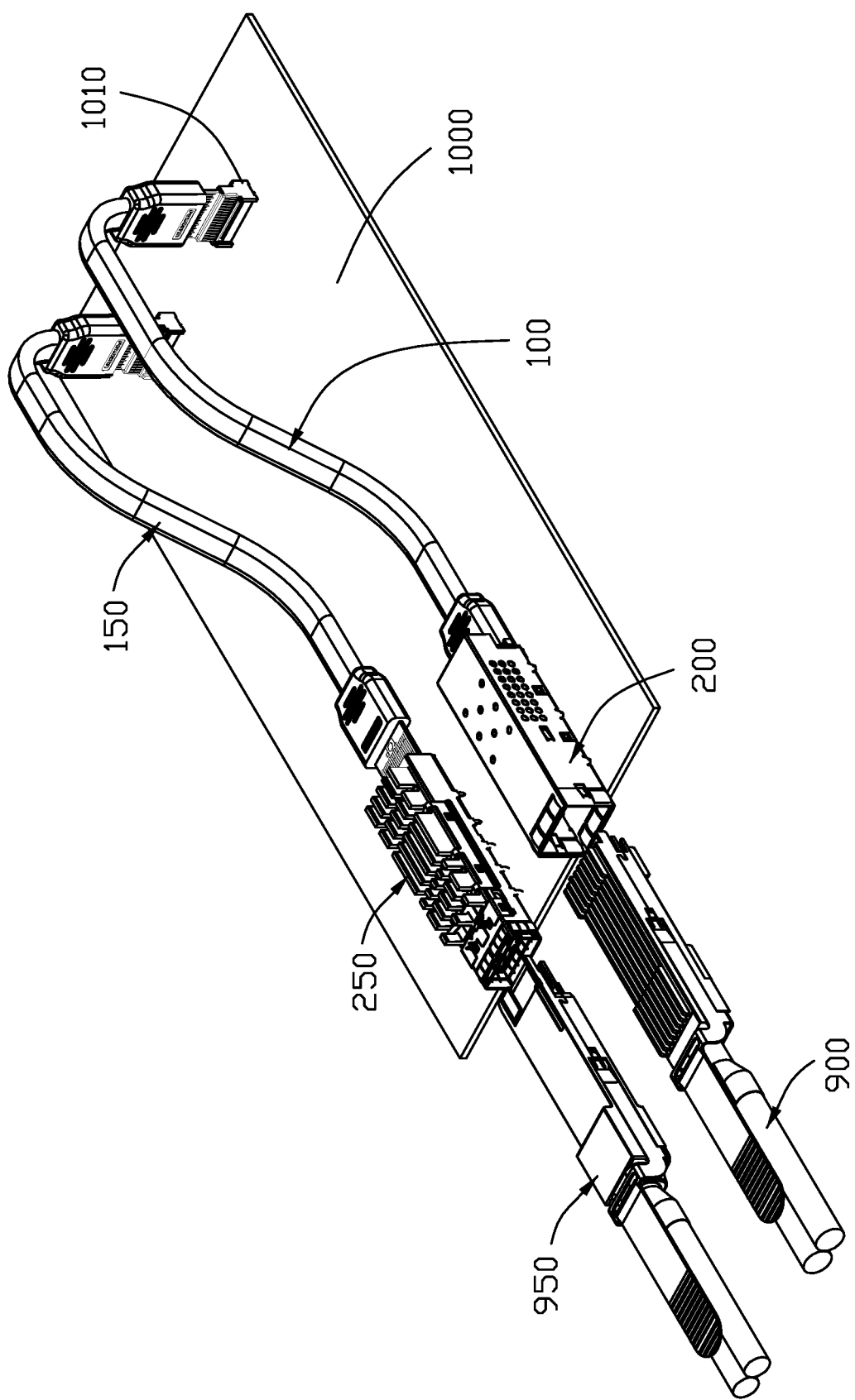
FIG. 1(A) is a perspective view of an electrical system according to a first embodiment of the invention.
Figure 1B:
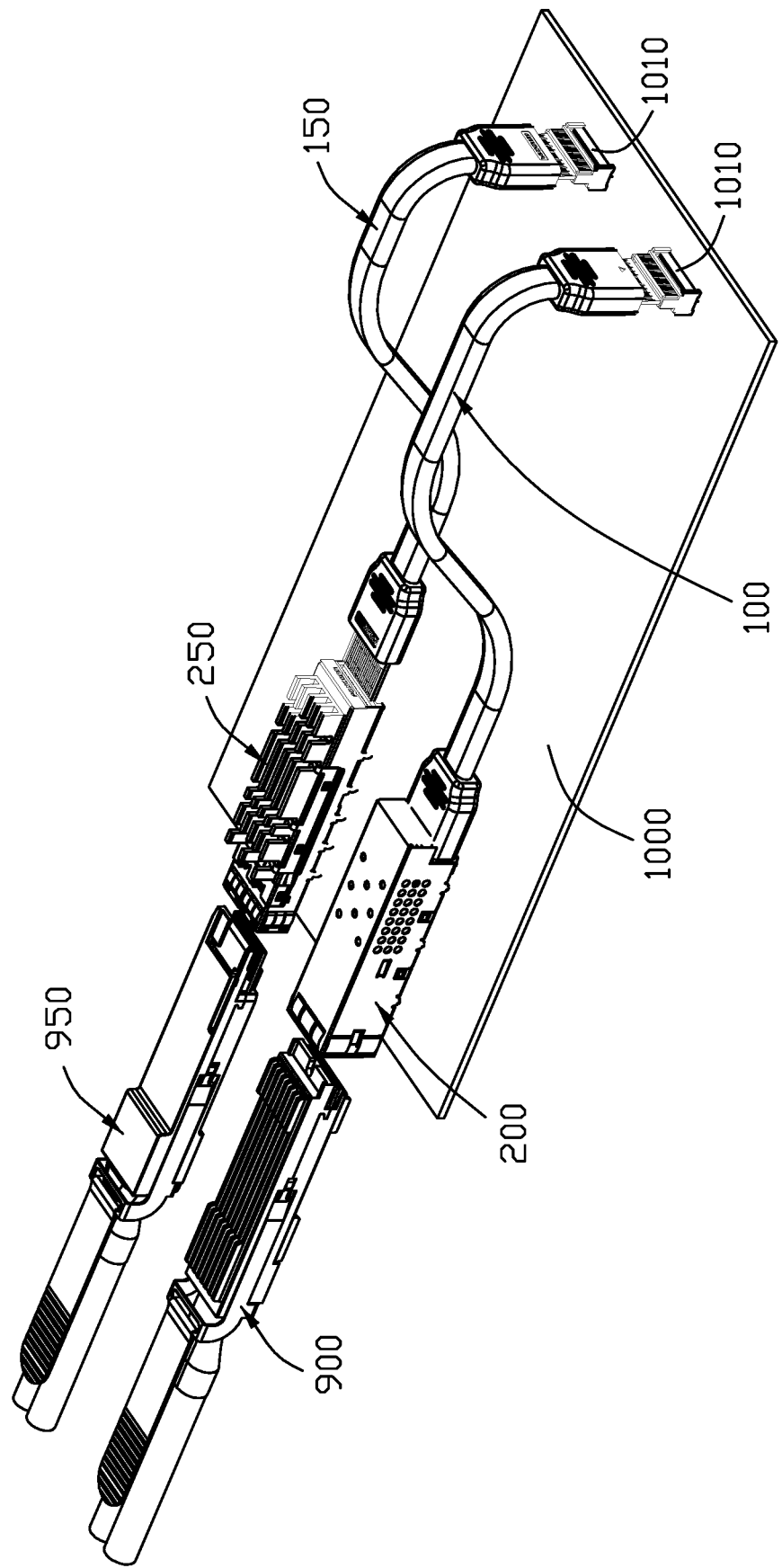
FIG. 1(B) is another perspective view of an electrical system of FIG. 1(A)
Figure 2:
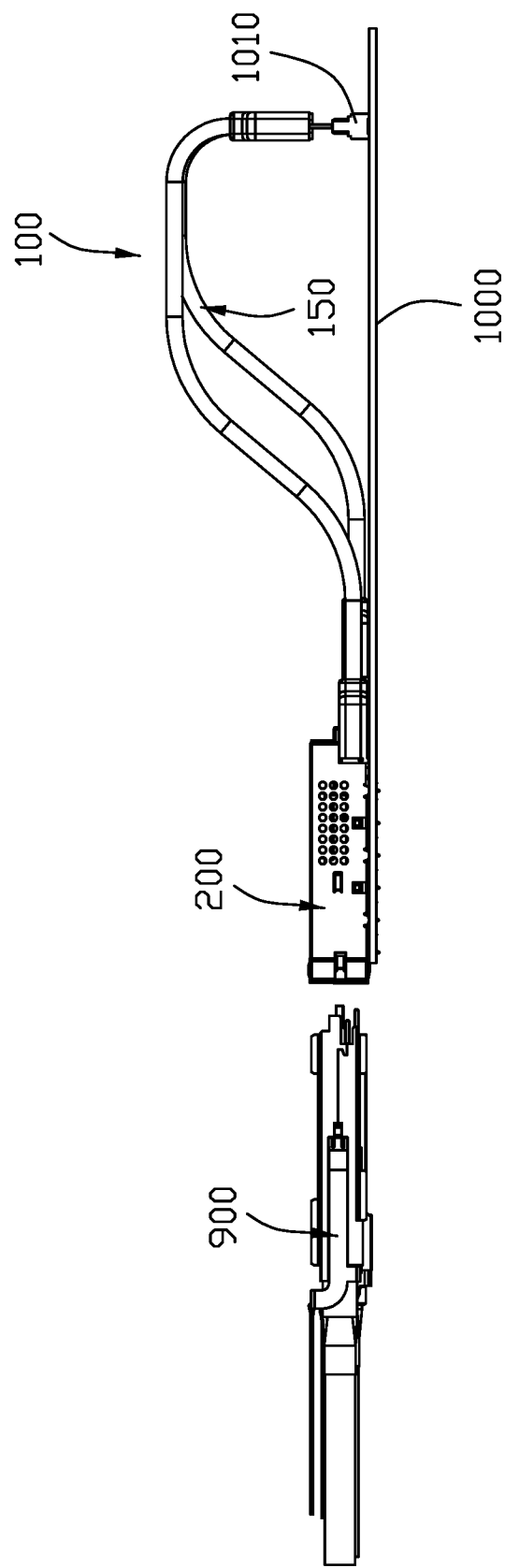
FIG. 2 is a side view of the electrical system of FIG. 1(A)
Figure 3A:
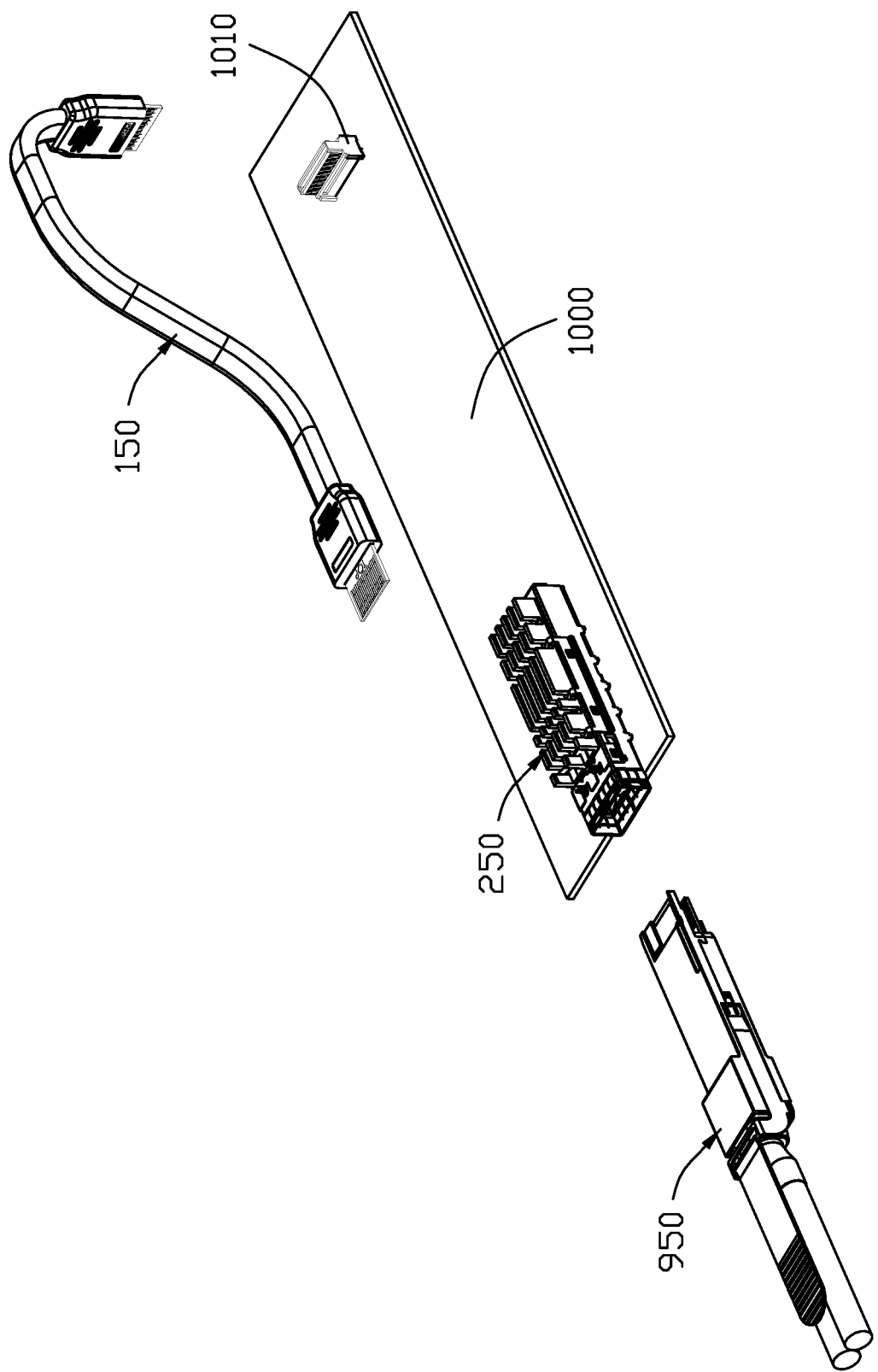
FIG. 3(A) is an exploded perspective view of a first half of the electrical system of FIG. 1(A)
Figure 3B:
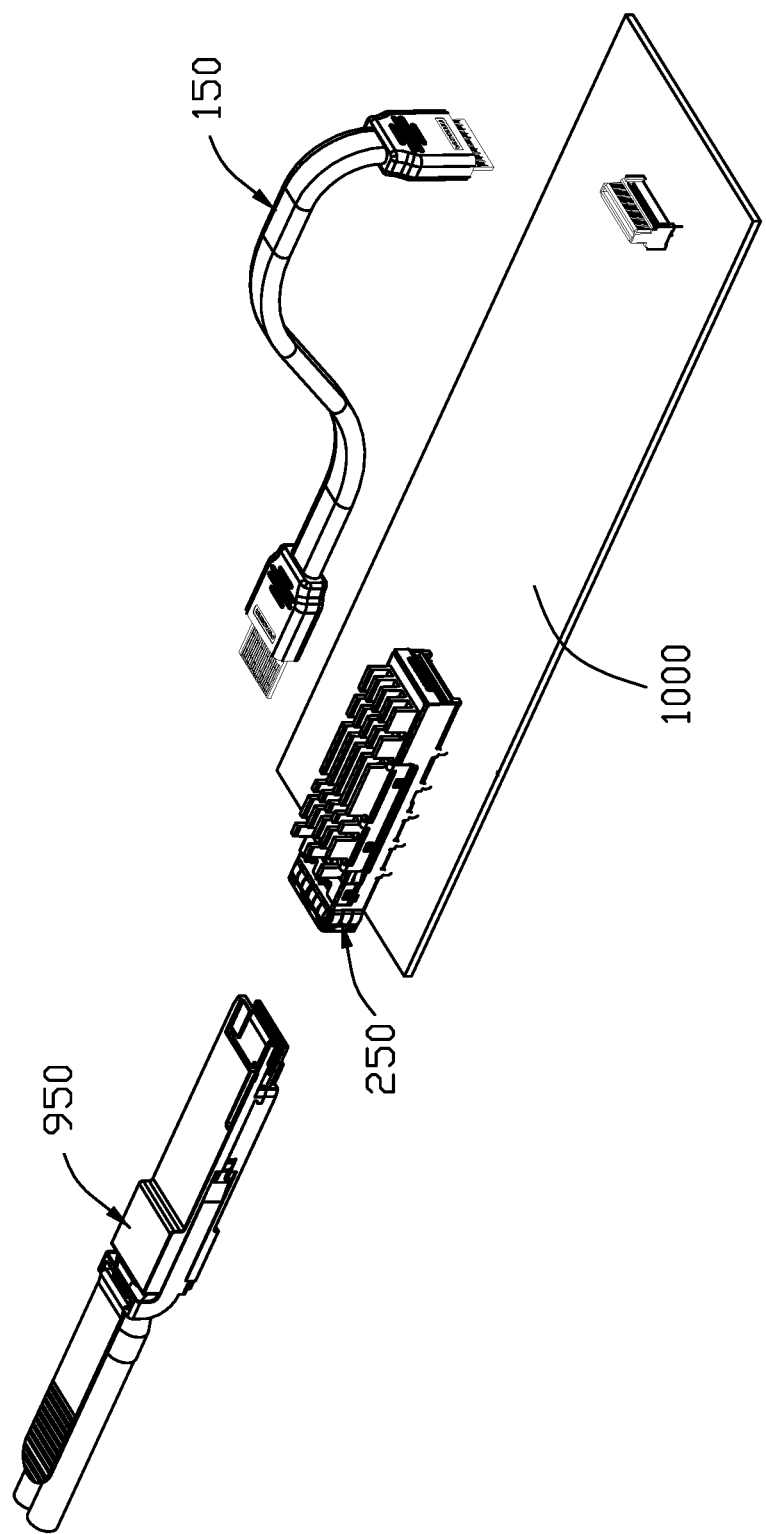
FIG. 3(B) is another exploded perspective view of the first half of the electrical system of FIG. 3(A)

Reference will now be made in detail to the preferred embodiment of the present invention. Referring to FIGS. 1(A) to 15(B), an electrical system includes a main board 1000 with a first half and a second half side by side arranged with each other in a transverse direction. The first half of the electrical system includes a first adaptor cable assembly 150 connected between a vertical FP5 receptacle connector 1010 and a first module insertion port 250. The second half of the electrical system includes a second adaptor cable assembly 100 connected between another vertical FP5 receptacle connector 1010 and a second module insertion port 200. In this embodiment, the first module insertion port 250 is to receive the corresponding QSFP-DD pluggable module 950 while the second module insertion port 200 is to receive the corresponding FP5 pluggable module 900.

Figure 4A:
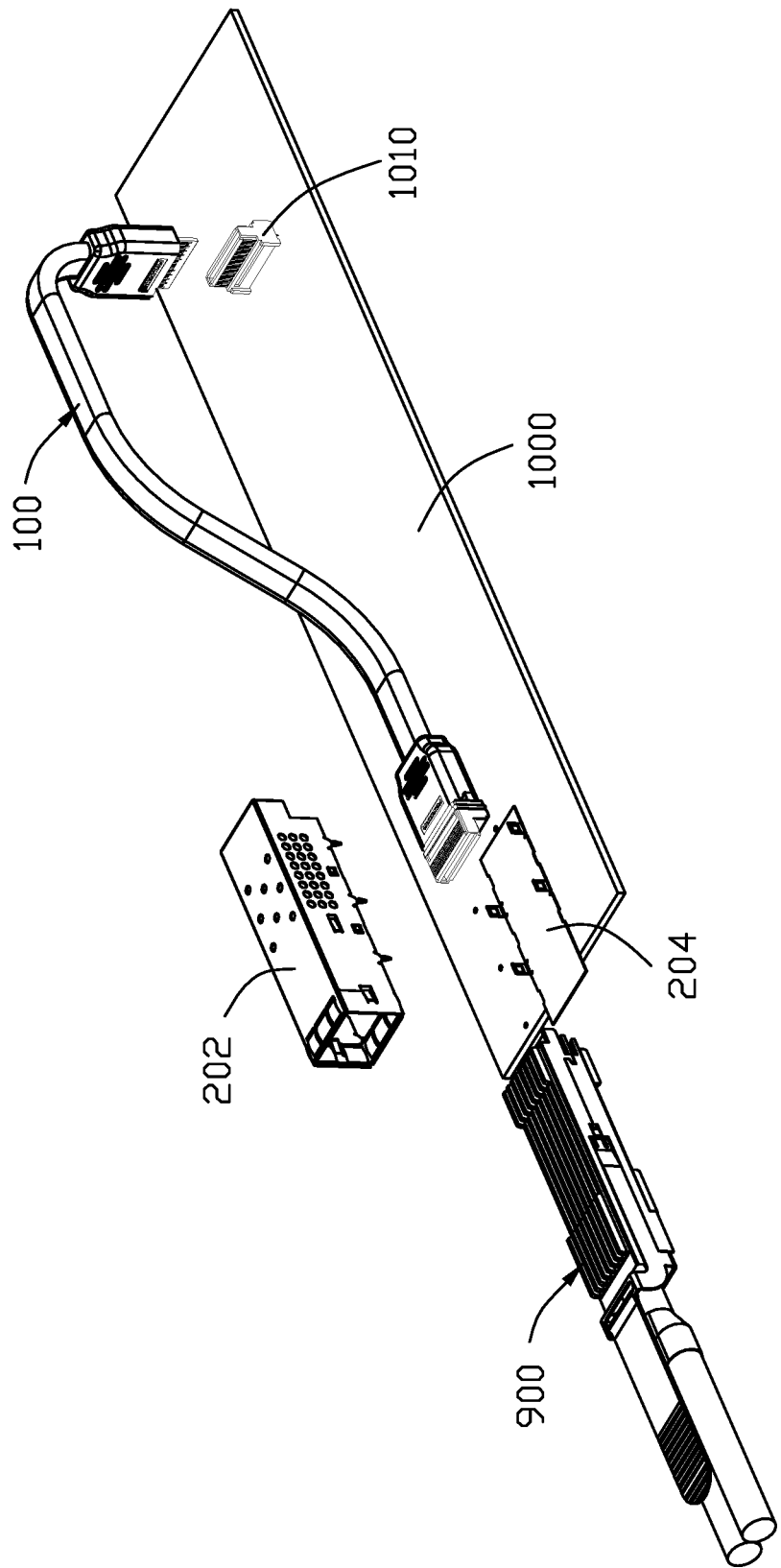
FIG. 4(A) is an exploded perspective view of a second half of the electrical assembly of FIG. 1(A)
Figure 4B:
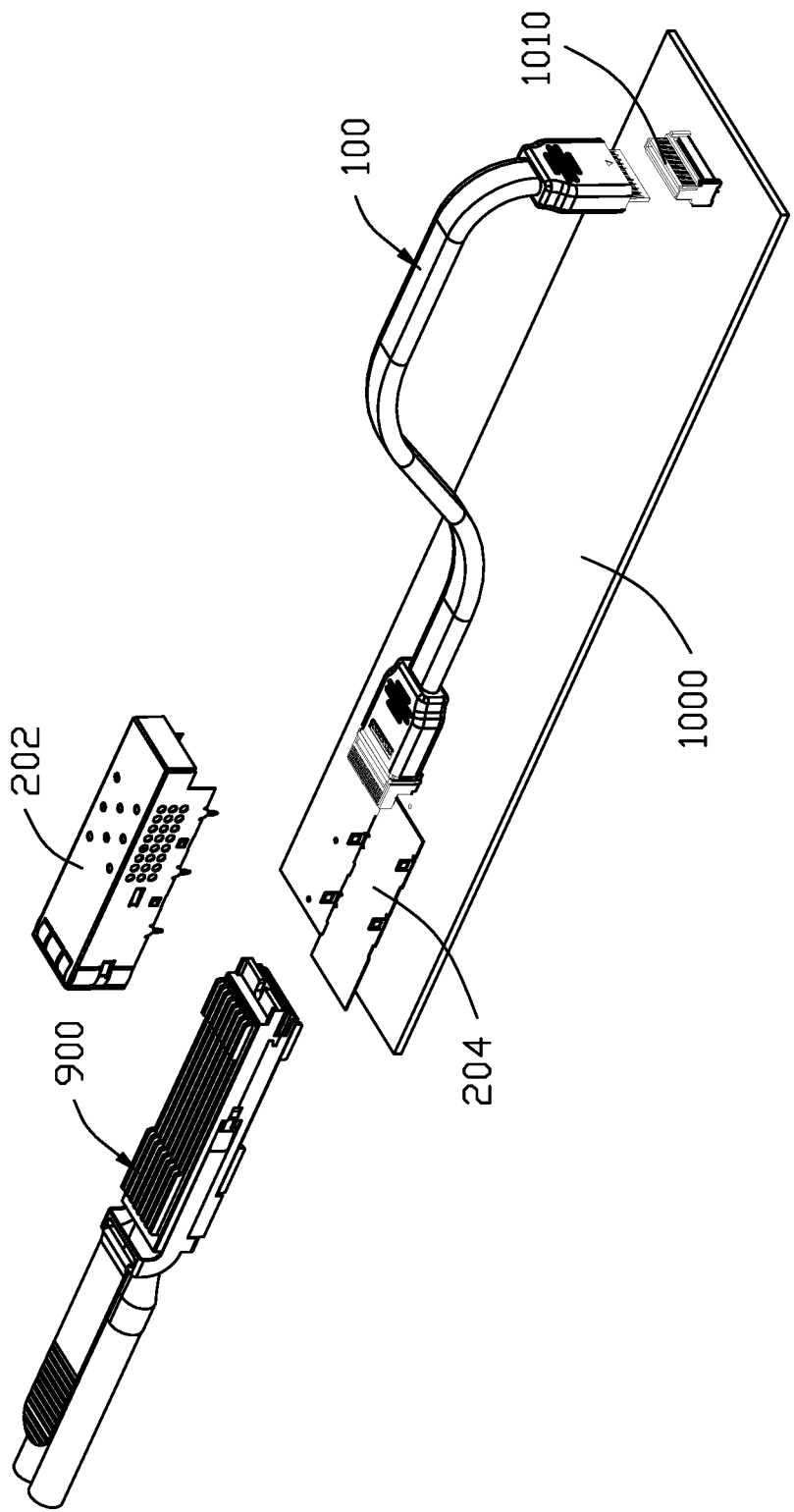
FIG. 4(B) is another exploded perspective view of the second half of the electrical system of FIG. 4(A)
Figure 5:
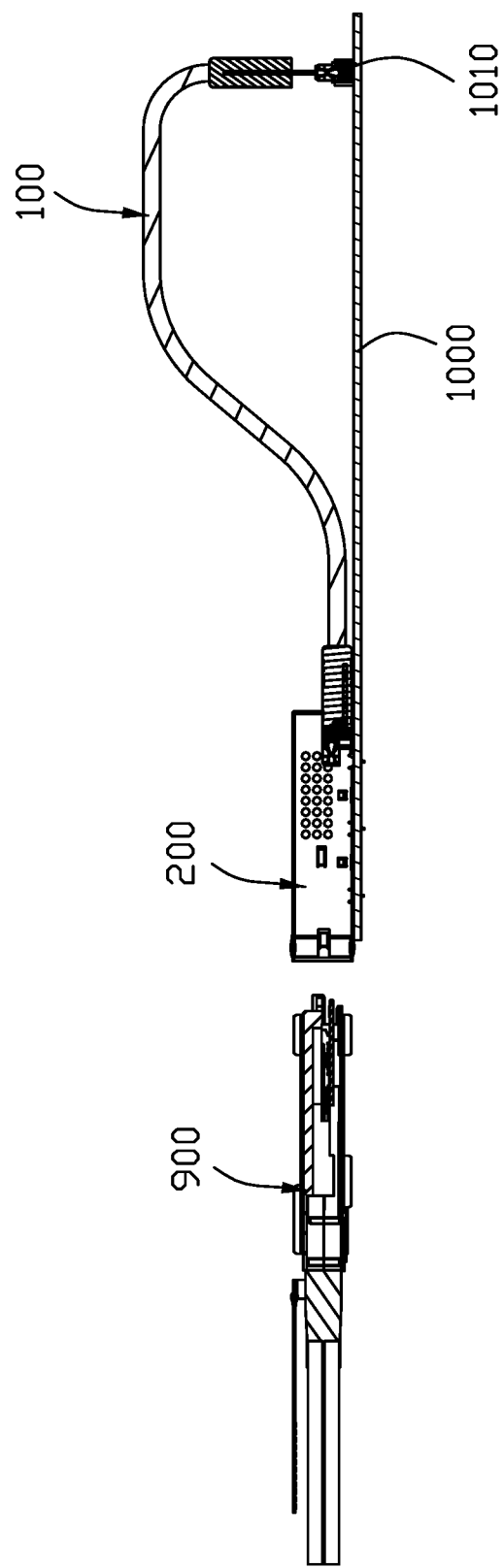
FIG. 5 is a side view of the second half of the electrical system of FIG. 4(A)
Figure 6:
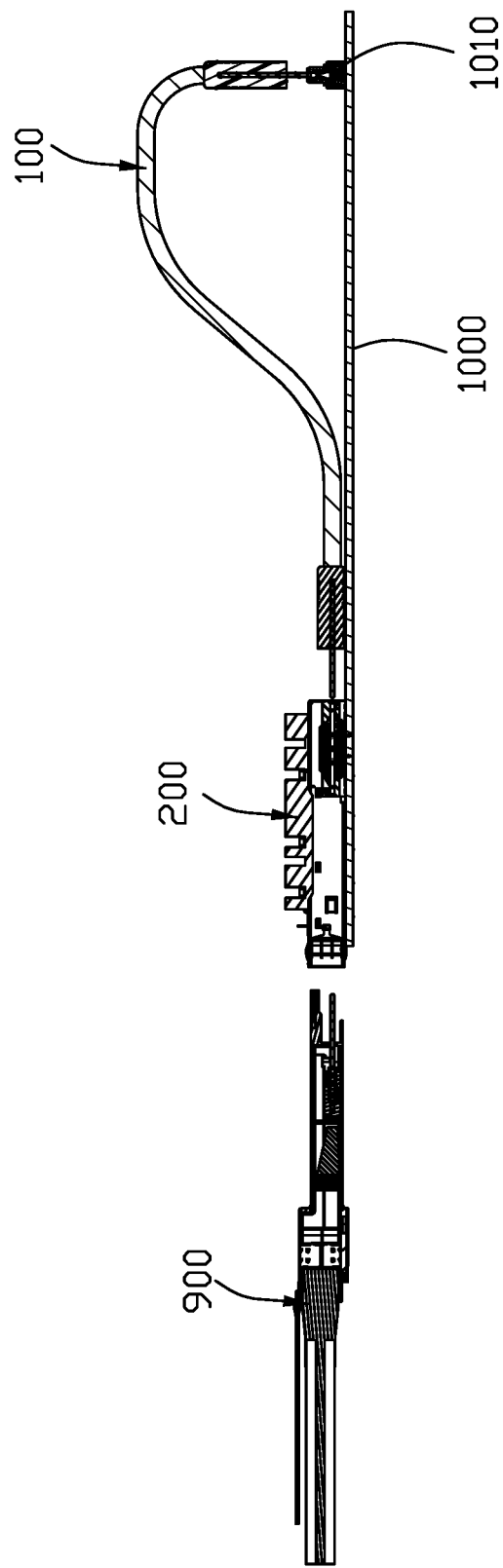
FIG. 6 is a side view of the first half of the electrical system of FIG. 3(A) wherein the reference numerals are mistyped with those of the second half.
Figure 7A:
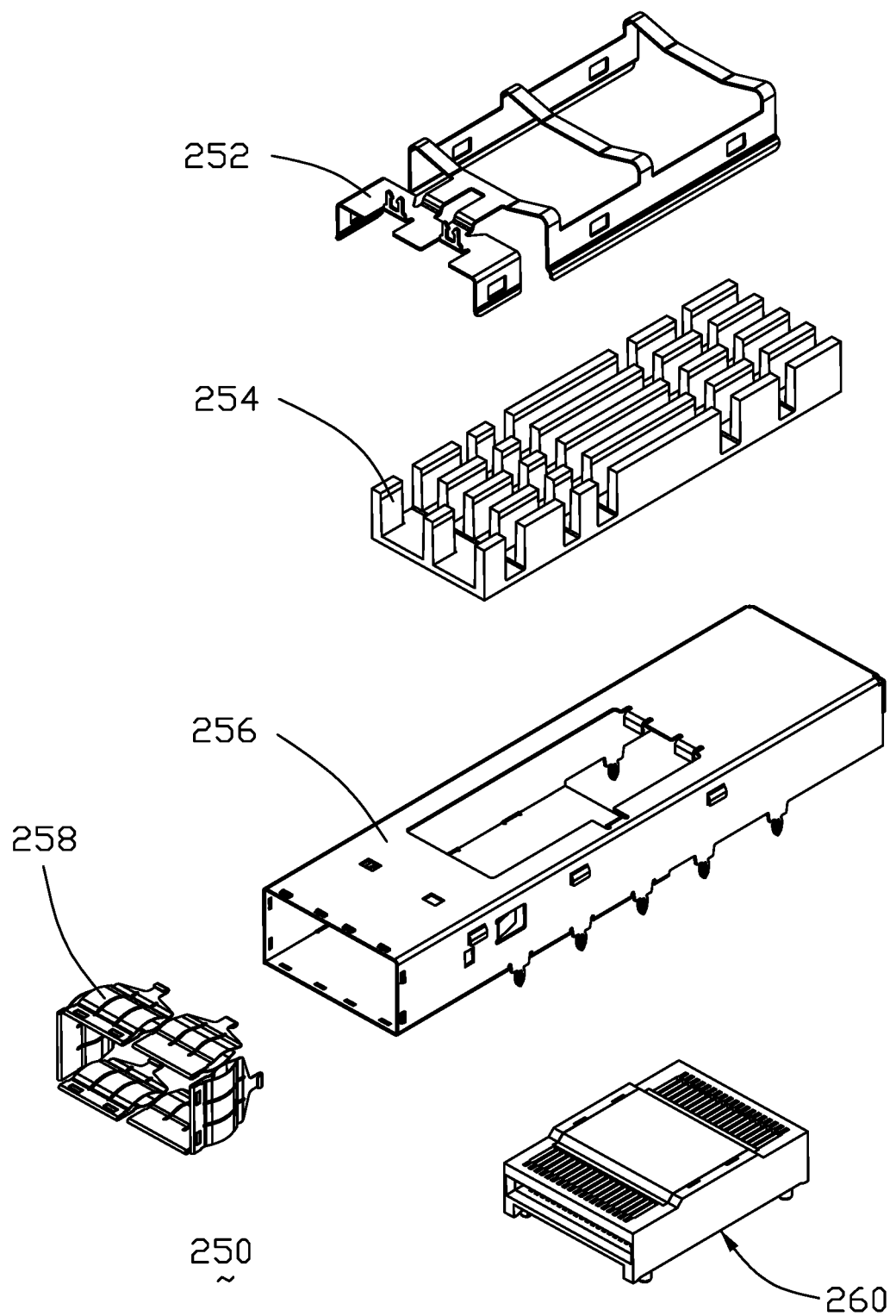
FIG. 7(A) is an exploded perspective view of the module insertion port assembly of the first half of the electrical system of FIG. 3(A)
Figure 7B:
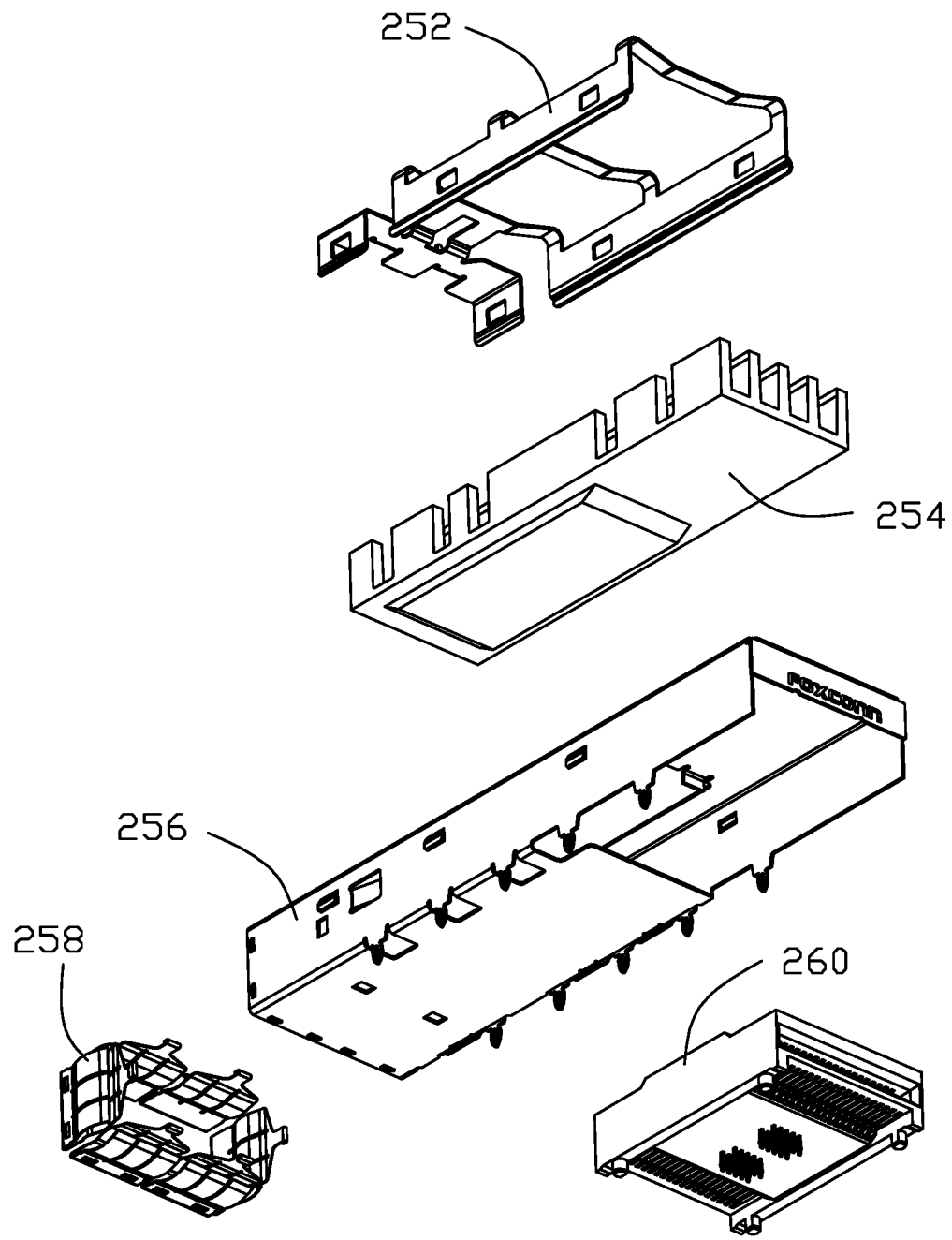
FIG. 7(B) is another exploded perspective view of the module insertion port assembly of the first half of the electrical system of FIG. 7(A)

As shown in FIGS. 4(A) and 4(B), the second module insertion port 200 is essentially a hollow metallic cage formed by the main part 202 and the bottom part 204 while as shown in FIGS. 7(A) and 7(B), the first module insertion port 250 includes a hollow metallic cage 256 with a heat sink 254 attached thereon via the clip 252 and communicatively facing an interior space of the cage 256 through the opening (not labeled) for removing the heat from the inserted pluggable module 950. A metallic gasket 258 is attached upon the cage 256 around the front opening (not labeled), and a dual-sided receptacle connector or the so-called extender or adaptor 260 are located around a rear end region of the cage 256.

Figure 8A:
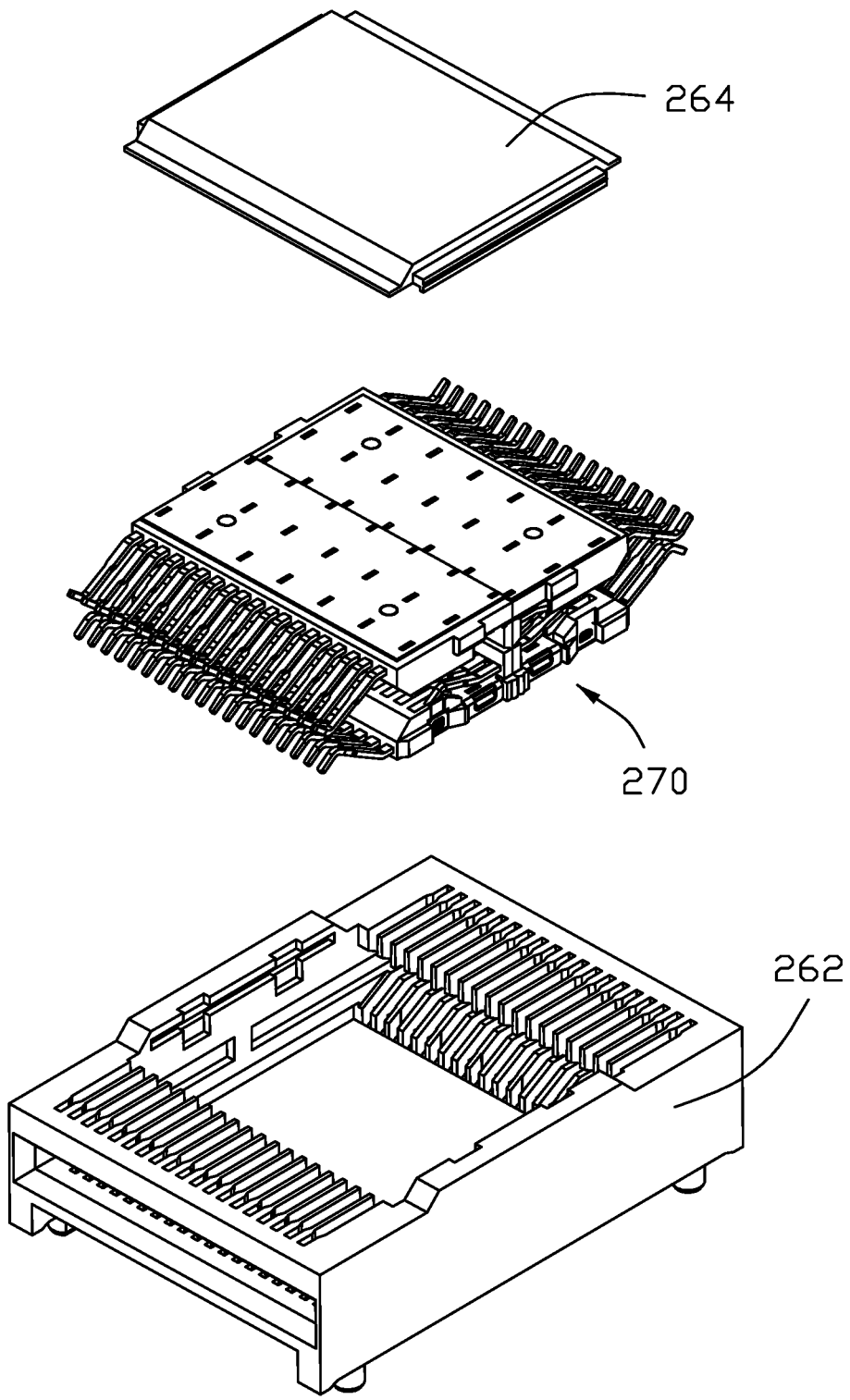
FIG. 8(A) is an exploded perspective view of the dual-sided receptacle connector of the module insertion port assembly of the first half of the electrical system of FIG. 7(A)
Figure 8B:
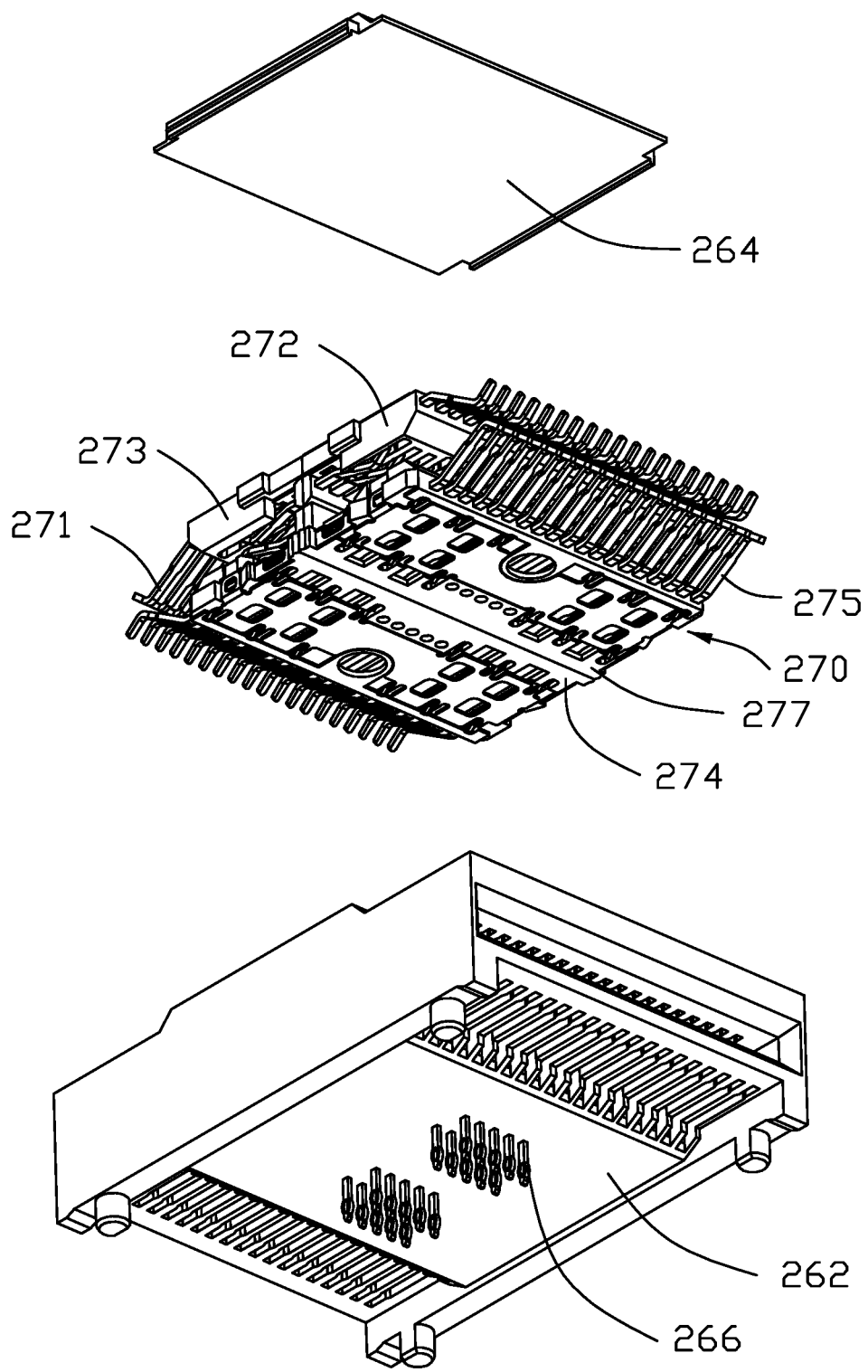
FIG. 8(B) is another exploded perspective view of the dual-sided receptacle connector of the module insertion port assembly of the first half of the electrical system of FIG. 8(A)

As shown in FIGS. 8(A) and 8(B), the dual-sided receptacle connector 260 includes an insulative housing 262, a contact module 270 is assembled therein, and an insulative cover 264 is attached thereon to retain the contact module 270 in position. The contact module 270 essentially includes the upper inner part 272, the upper outer part 271, the lower inner part 277 and the lower outer part 279 assembled together wherein each part has its own contacts 275 and both the upper inner part 272 and the lower inner part 277 are disposed around the inner port of the housing 262, and both the upper outer part 271 and the lower outer part 279 are disposed around the outer port of the housing 262. The contact 275 has the corresponding mating portion disposed in the corresponding inner/outer port of the housing 262 so as to be deemed as the inner/outer mating portion. Understandably, the contacts 275 of lower inner part 277 and those of the lower outer part 279 are electrically connected, and the contacts 275 of the upper inner part 272 and those of the upper outer part 271 are electrically connected as well so as to transmit the signals from the corresponding QSFP-DD pluggable module 950 to the first adaptor cable assembly 150 and vice versa. In this embodiment, additional conductive connecting legs/tails 266 for mounting to the printed circuit board 1000, are associated with the dual-sided receptacle connector 260 and mechanically and electrically connected to the corresponding contacts 275 around the center region wherein such contacts 275 are for optional low speed signal transmission. In other words, as mentioned above the high speed transmission is done by the cable 310 disclosed in another embodiment while the low speed transmission is done by the printed circuit board without involvement with the cable 310 disclosed in another embodiment. The details of the contact module 270 will be illustrated later with reference to FIGS. 23(A)-24(B). Also, the mating among the QSFP-DD pluggable module 950, the one floor type dual-sided receptacle connector 260 and the first adaptor cable assembly 150 will be illustrated later with reference to FIGS. 16(A)-18.

Figure 9:
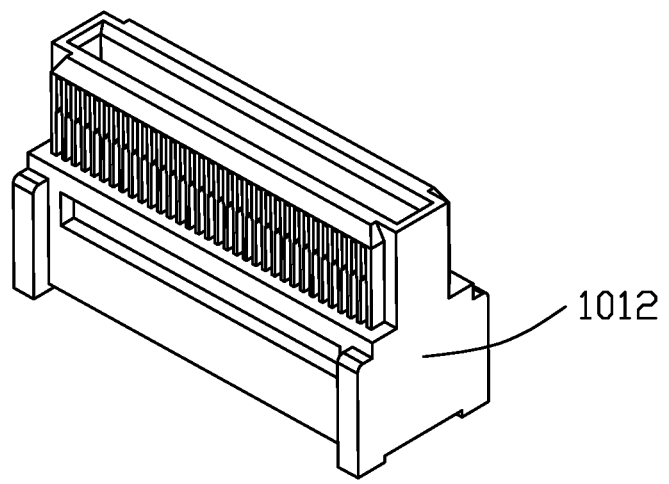
FIG. 9 is an FP5 vertical receptacle connector of the first half of the electrical system of FIG. 3(A)
Figure 9:
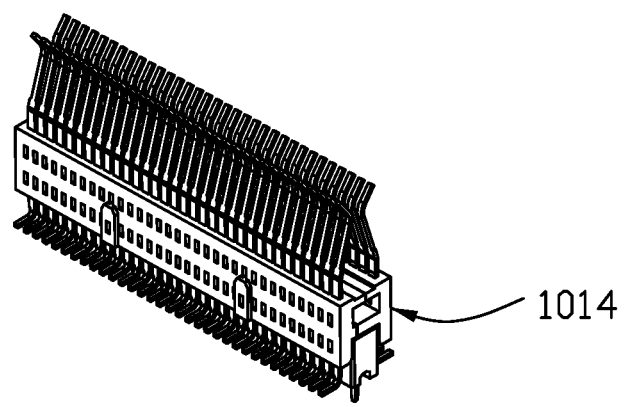
Figure 10:
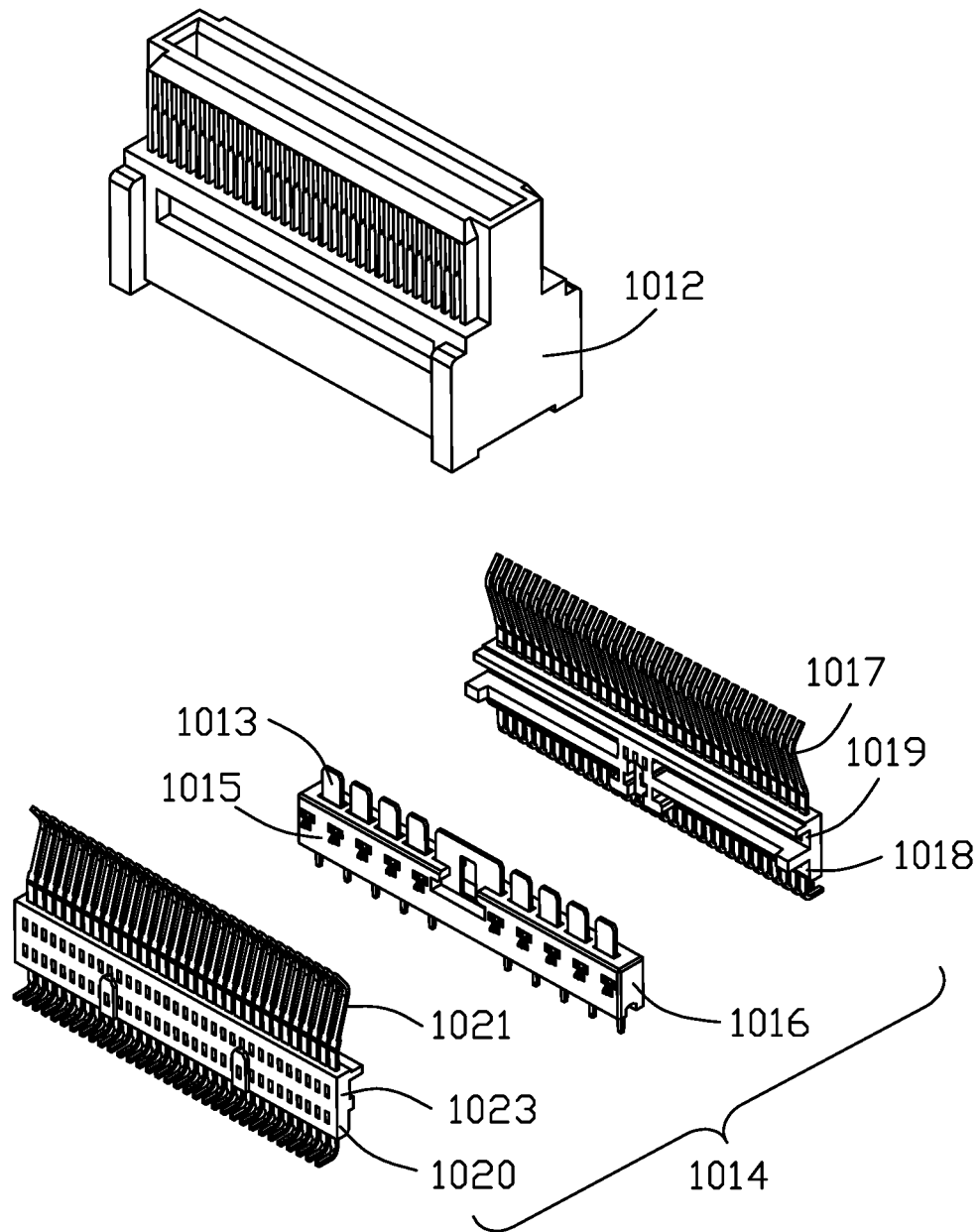
FIG. 10 is a further exploded perspective view of the FP5 vertical receptacle connector of the first half of the electrical system of FIG. 9.

As shown in FIGS. 9-10, the vertical receptacle connector 1010 is essentially of an FP5 interface and includes an insulative housing 1012 with a contact module 1014 therein. The contact module 1014 includes a first part 1018 composed of the contacts 1017 integrally formed within the first insulator 1019, a second part 1020 composed of the contacts 1021 integrally formed within the second insulator 1023, and a third part 1016 sandwiched between the first part 1018 and the second part 1020 and composed of the shielding pieces 1013 integrally formed within a third insulator 1015.

Figure 11:
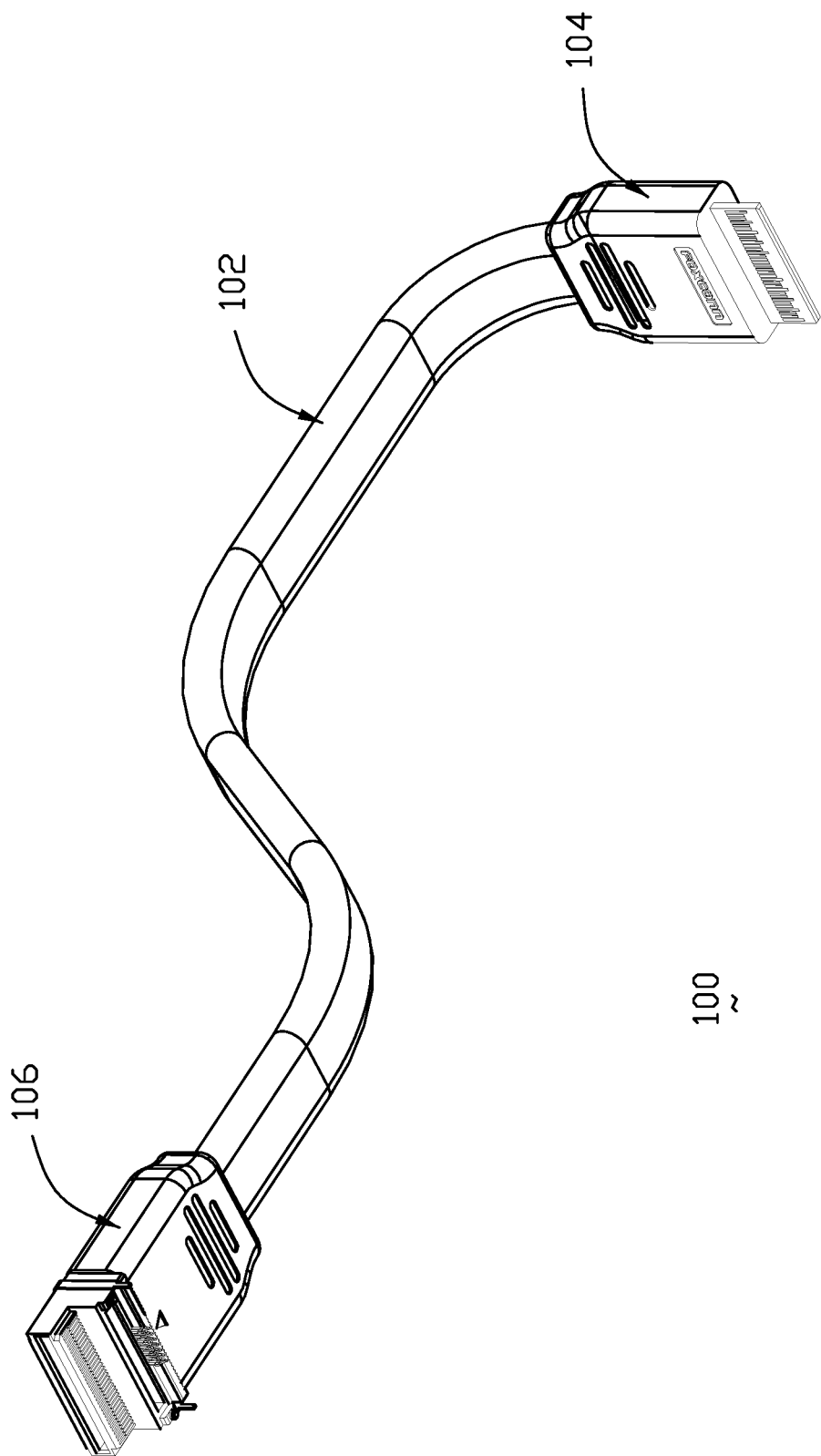
FIG. 11 is a perspective view of the adaptor cable of the second half of the electrical system of FIG. 4(A)
Figure 12A:
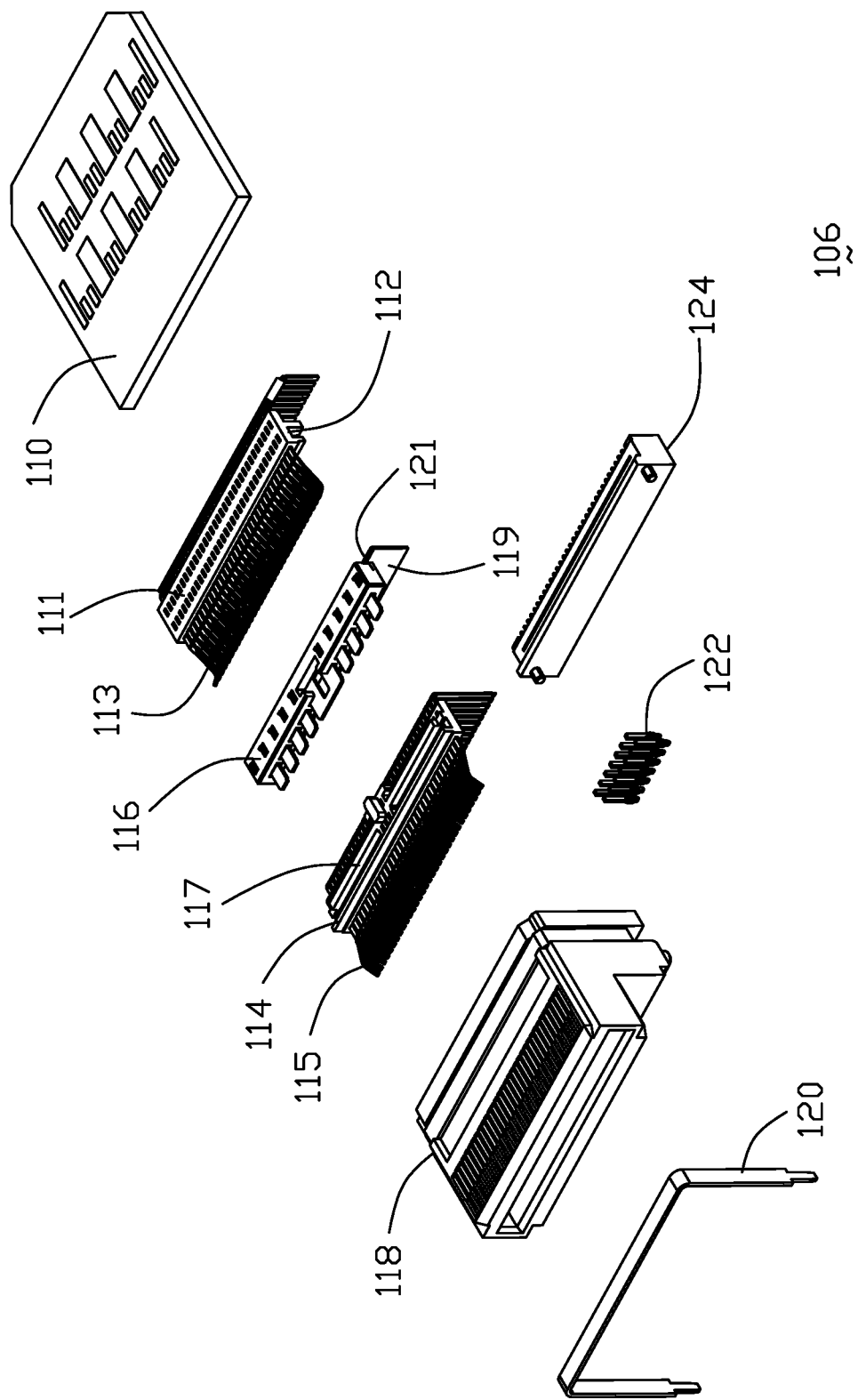
FIG. 12(A) is an exploded perspective view of the right angle receptacle connector directly attached to the adaptor cable of the second half of the electrical system of FIG. 11.
Figure 12B:
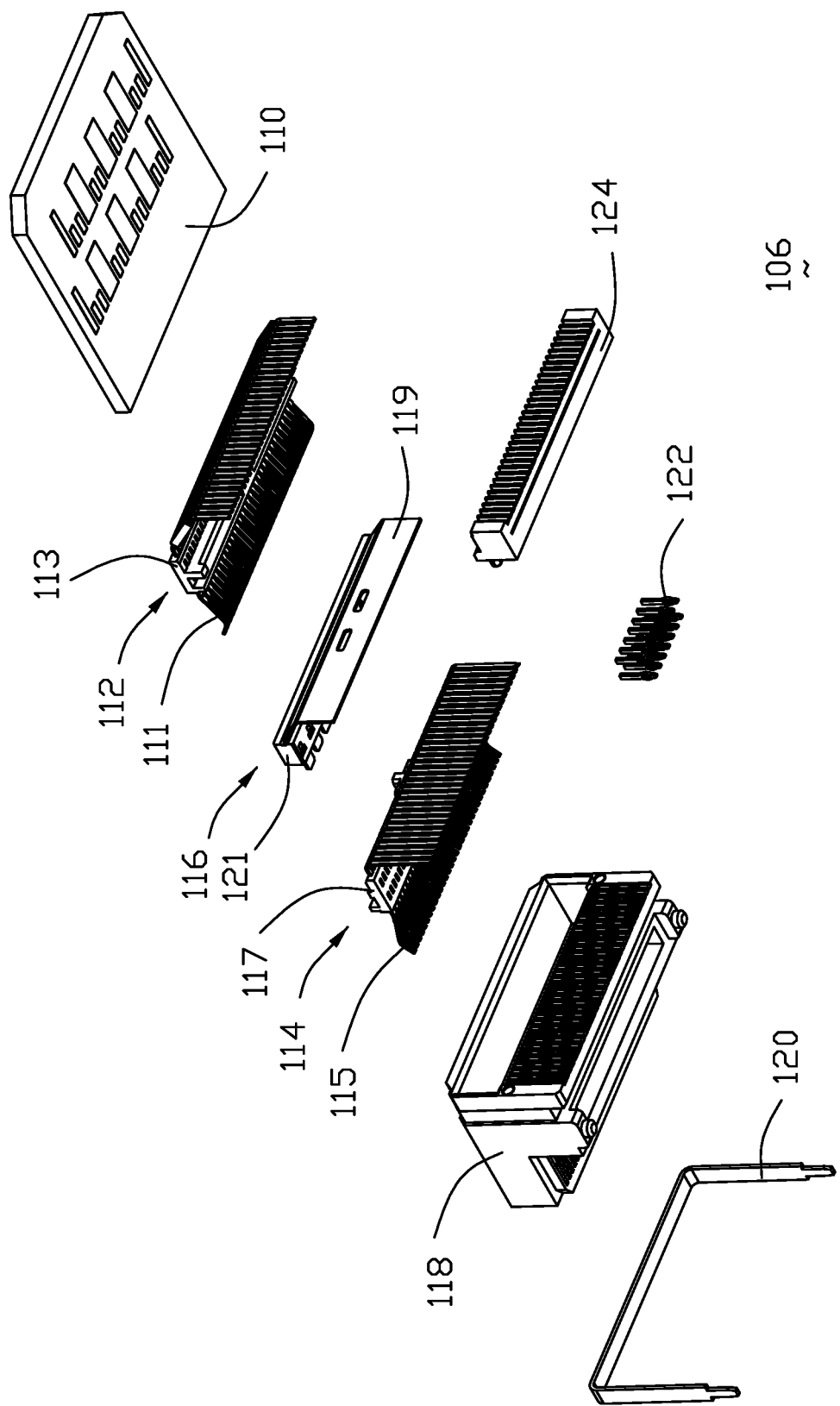
FIG. 12(B) is another perspective view of the right angle receptacle connector directly attached to the adaptor cable of the second half of the electrical system of FIG. 12(A)
Figure 13:
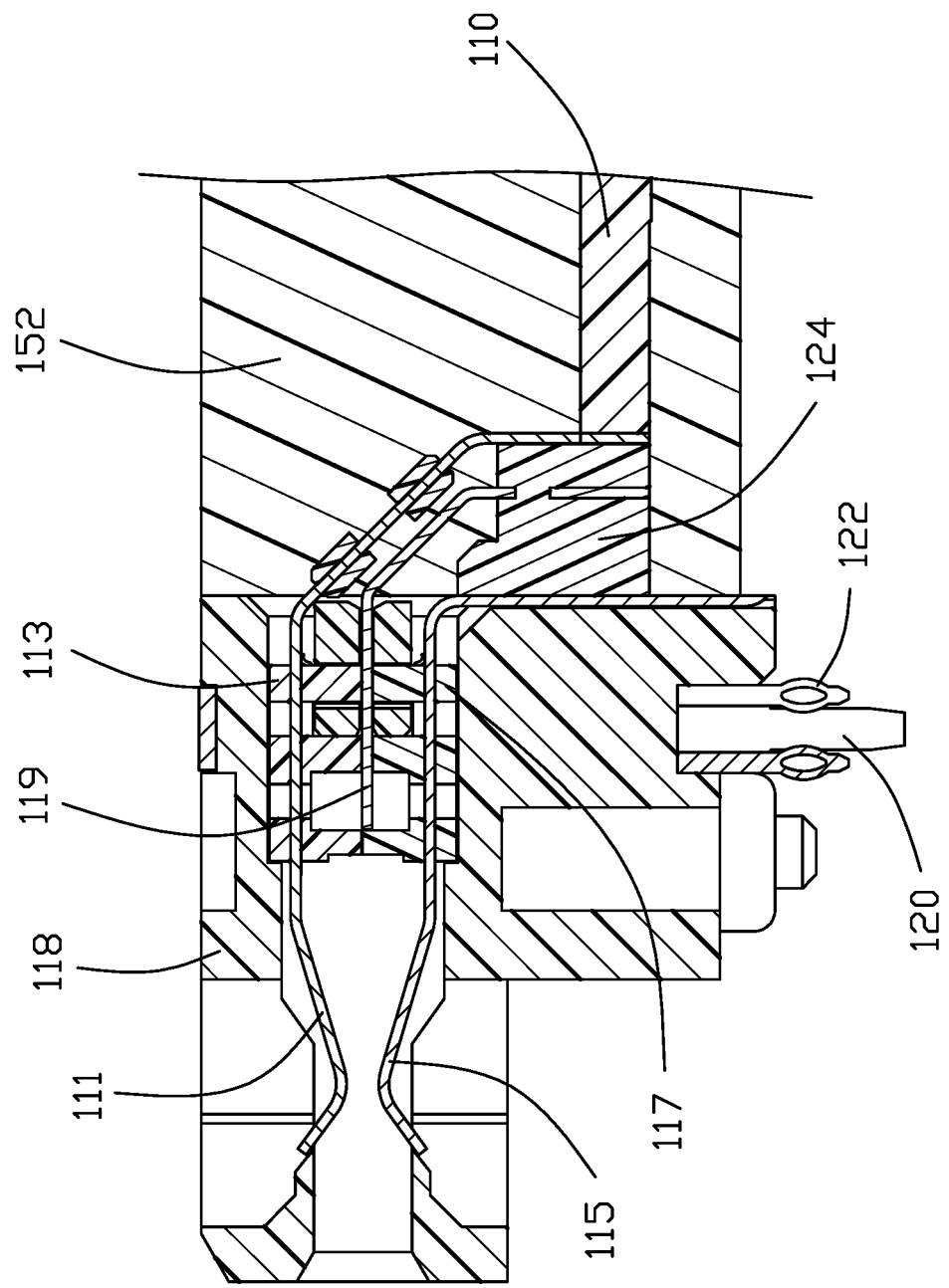
FIG. 13 is a cross-sectional view of the right angle receptacle connector directly attached to the adaptor cable of the second half of the electrical system of FIG. 12(A)

As shown in FIGS. 11-13, the second adaptor cable assembly 100 includes a cable 102 with an inner connector 104 at the inner end, and an outer connector 106 at the outer end. The inner connector 104 is essentially of a FP5 plug board interface for mating with the vertical receptacle connector 1010. The outer connector 106 includes an insulative housing 118 with a contact module (not labeled) therein. The contact module includes a first part 112 composed of the contacts 113 integrally formed within the first insulator 111, a second part 114 composed of the contacts 115 integrally formed within the second insulator 117, and a third part 116 sandwiched between the first part 112 and the second part 114 and composed of a metallic shielding piece 119 integrally formed within the third insulator 121. A spacer 124 is assembled to the housing 118 for regulating the contact tails (not labeled). A plurality of conductive connecting legs/legs 122 mechanically and electrically are connected to the corresponding contacts 113 and 115 around the center region and mounted to the main board 1000 for optional low speed signal transmission through the main board rather than through the adaptor cable assembly 100. A paddle card 110 are mechanically and electrically connected to the corresponding contacts 113 and 115 and protectively enclosed within the connector 106. A mounting clip 120 secures the connector 106 upon the main board 1000. Understandably, the outer connector 106 is mated with the FP5 pluggable module 900 which is inserted into the second module insertion port 200.

Figure 14:
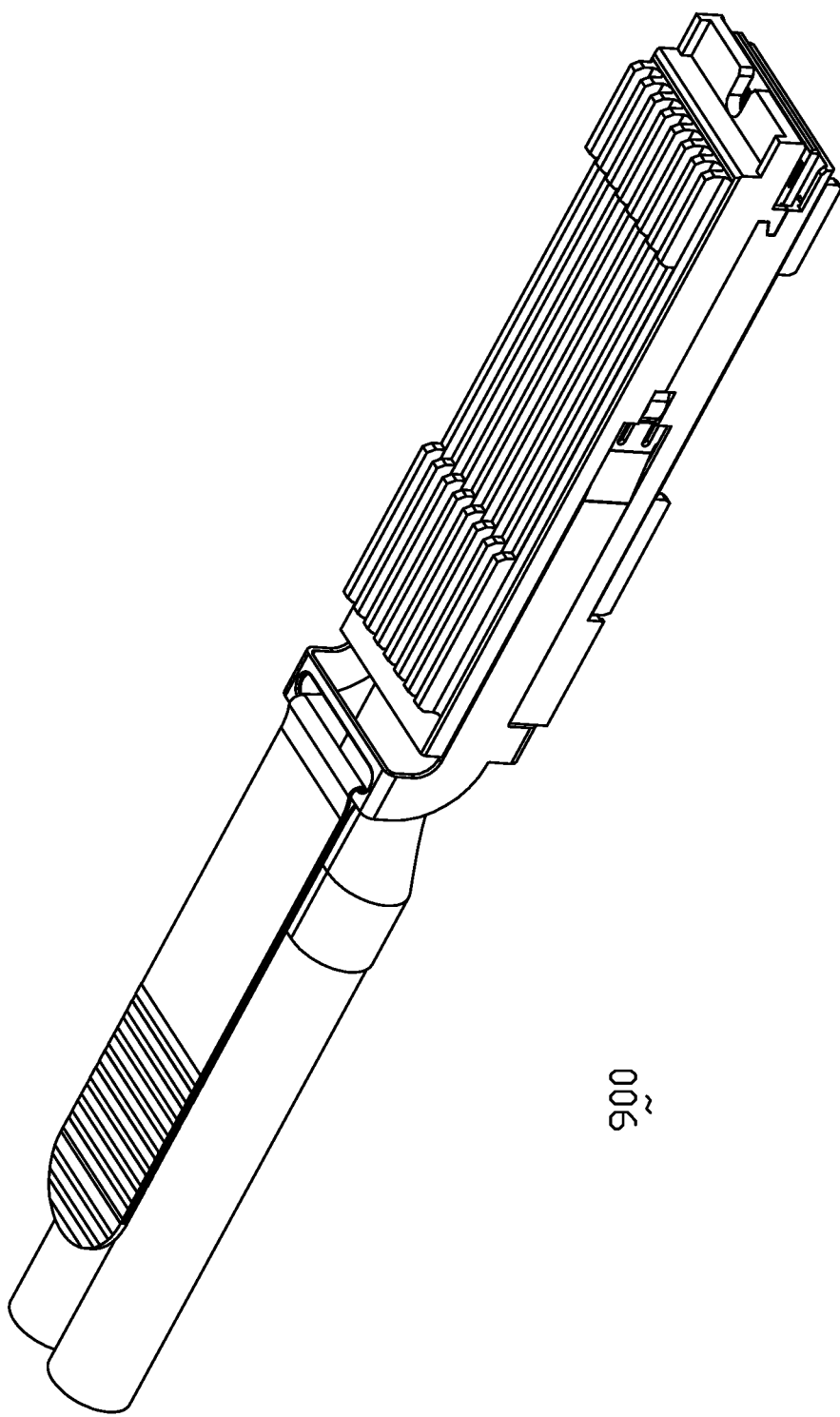
FIG. 14 is a perspective view of the FP5 pluggable module of the electrical system of FIG. 1(A)
Figure 15A:
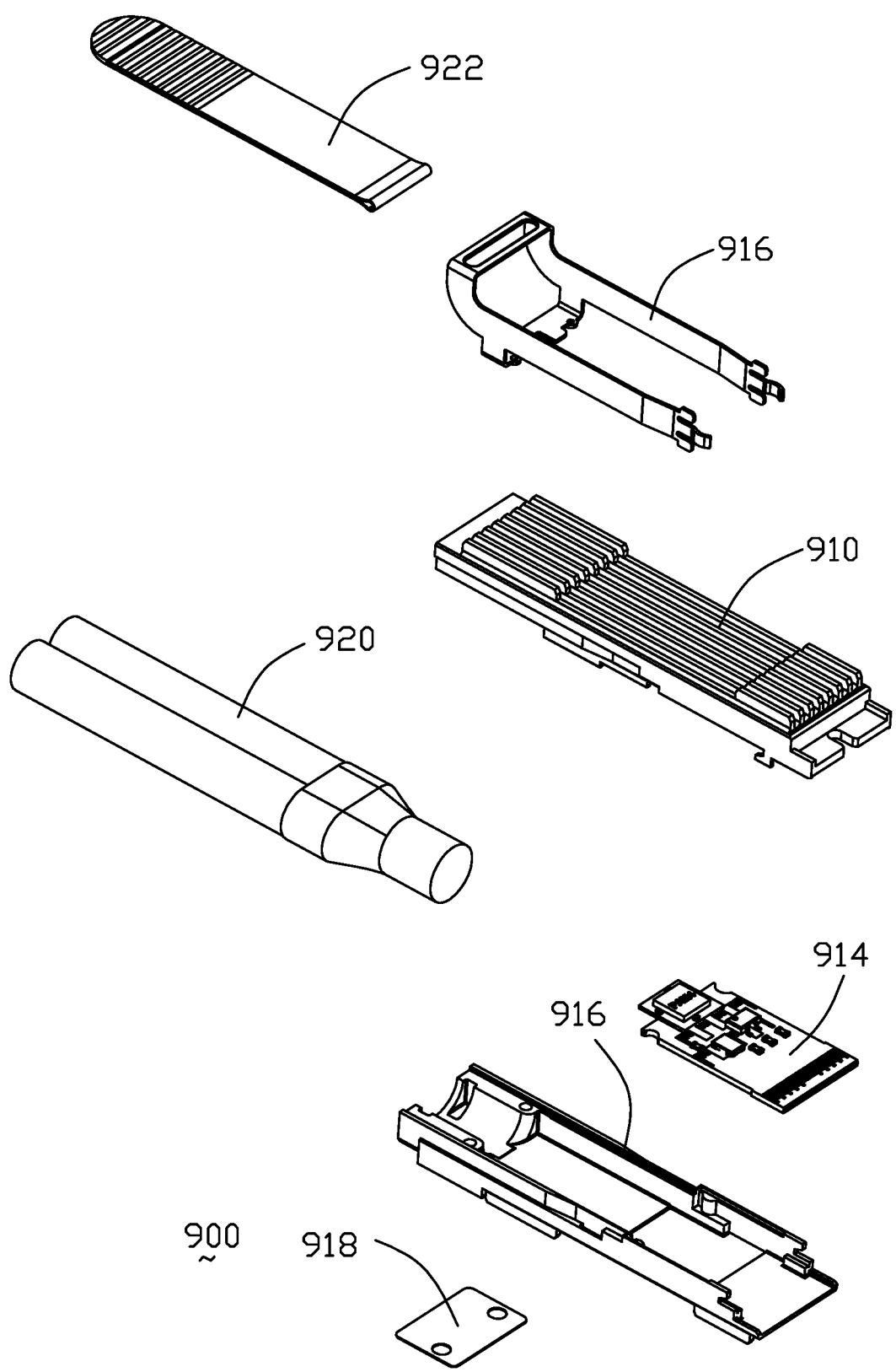
FIG. 15(A) is an exploded perspective view of the FP5 pluggable module of the electrical system of FIG. 14.
Figure 15B:
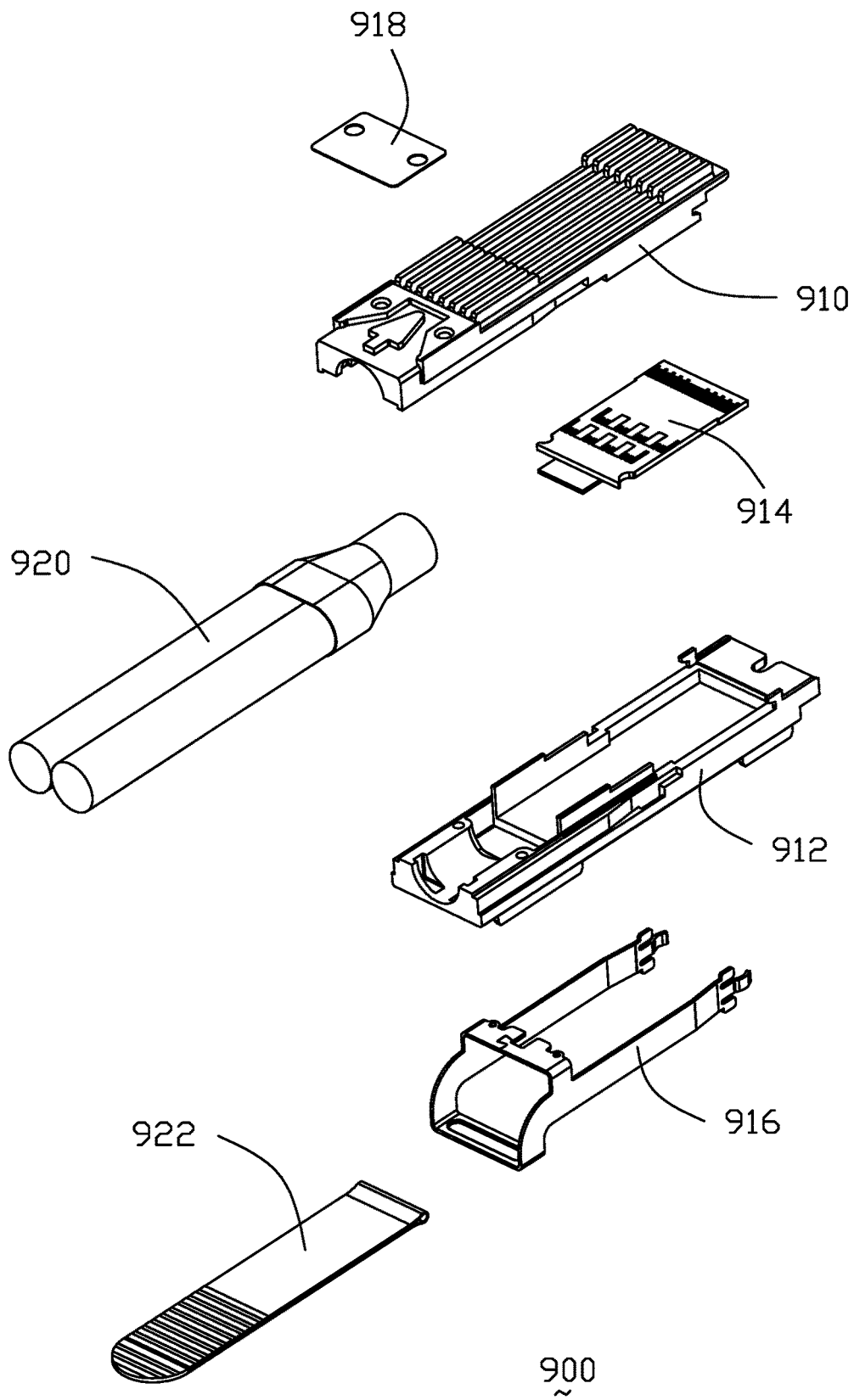
FIG. 15(B) is another exploded perspective view of the FP5 pluggable module of the electrical system of FIG. 14.
Figure 16A:
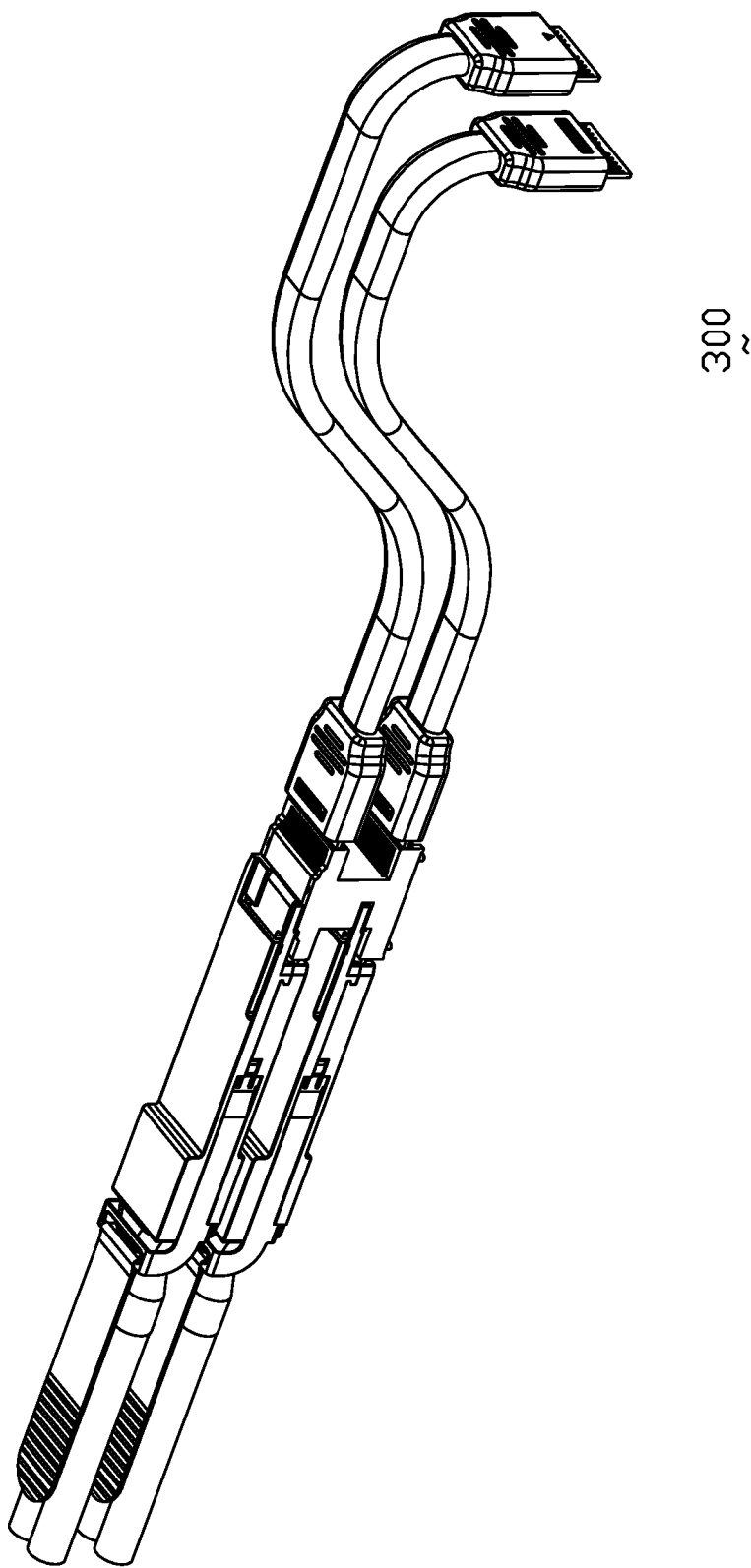
FIG. 16(A) is a perspective view of an electrical system according to a second embodiment of the invention using the stacked dual-sided QSFP-DD receptacle connector.

As shown in FIGS. 14-15(B), the FP5 pluggable module 900 includes a metallic top cover 910 with heat sink structure thereon and a metallic bottom cover 912 commonly forming an interior receiving space to receive a printed circuit board assembly 914 therein. A releasing bar 916 activated by a pull tape 922 is positioned upon the top cover 910 and the bottom cover 912. A cable 920 is connected to the printed circuit board assembly 914. A metallic cover 918 is attached upon the bottom cover 912.

Figure 17A:
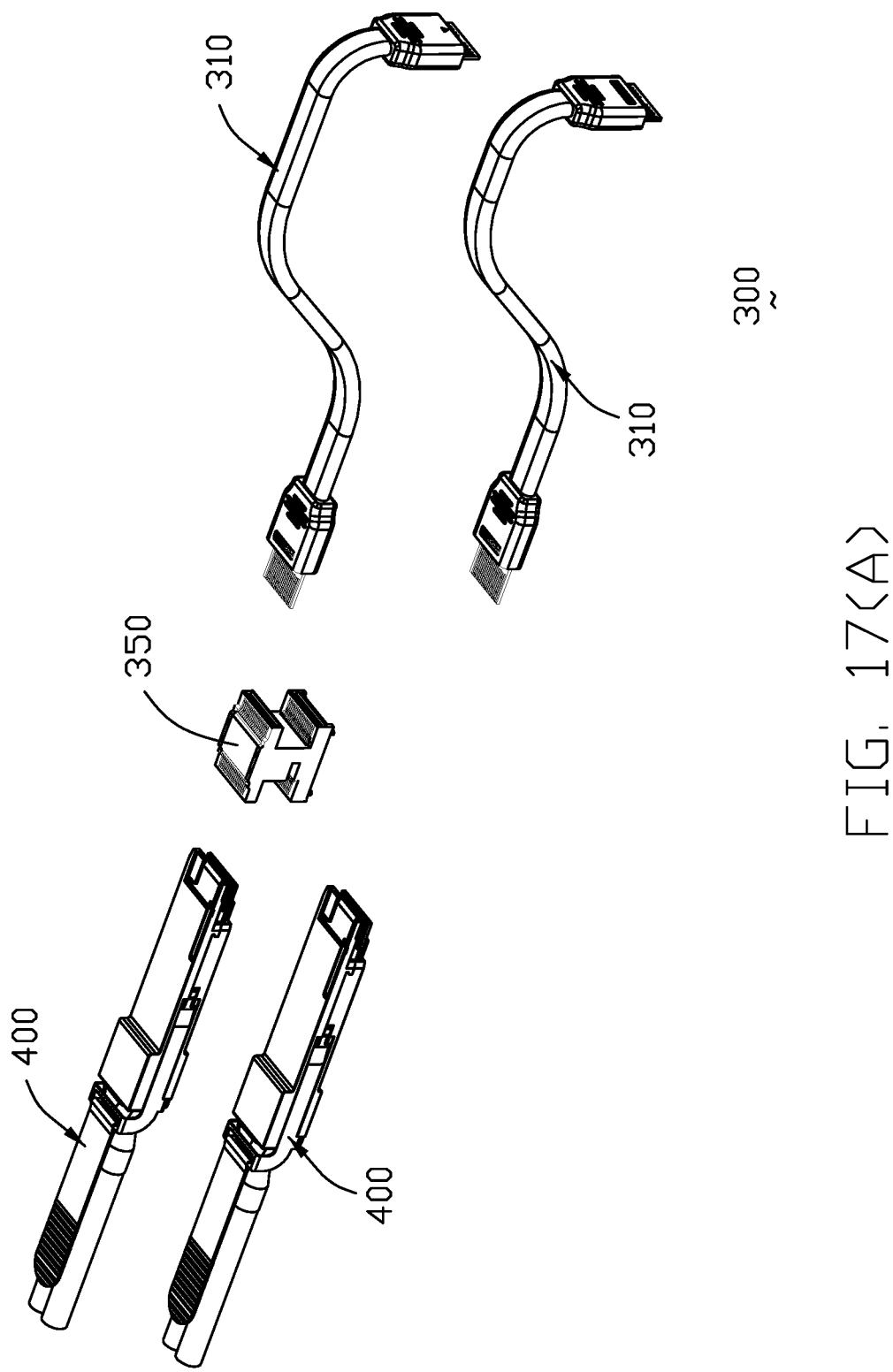
FIG. 17(A) is an exploded perspective view of the electrical system of FIG. 16(A)
Figure 17B:
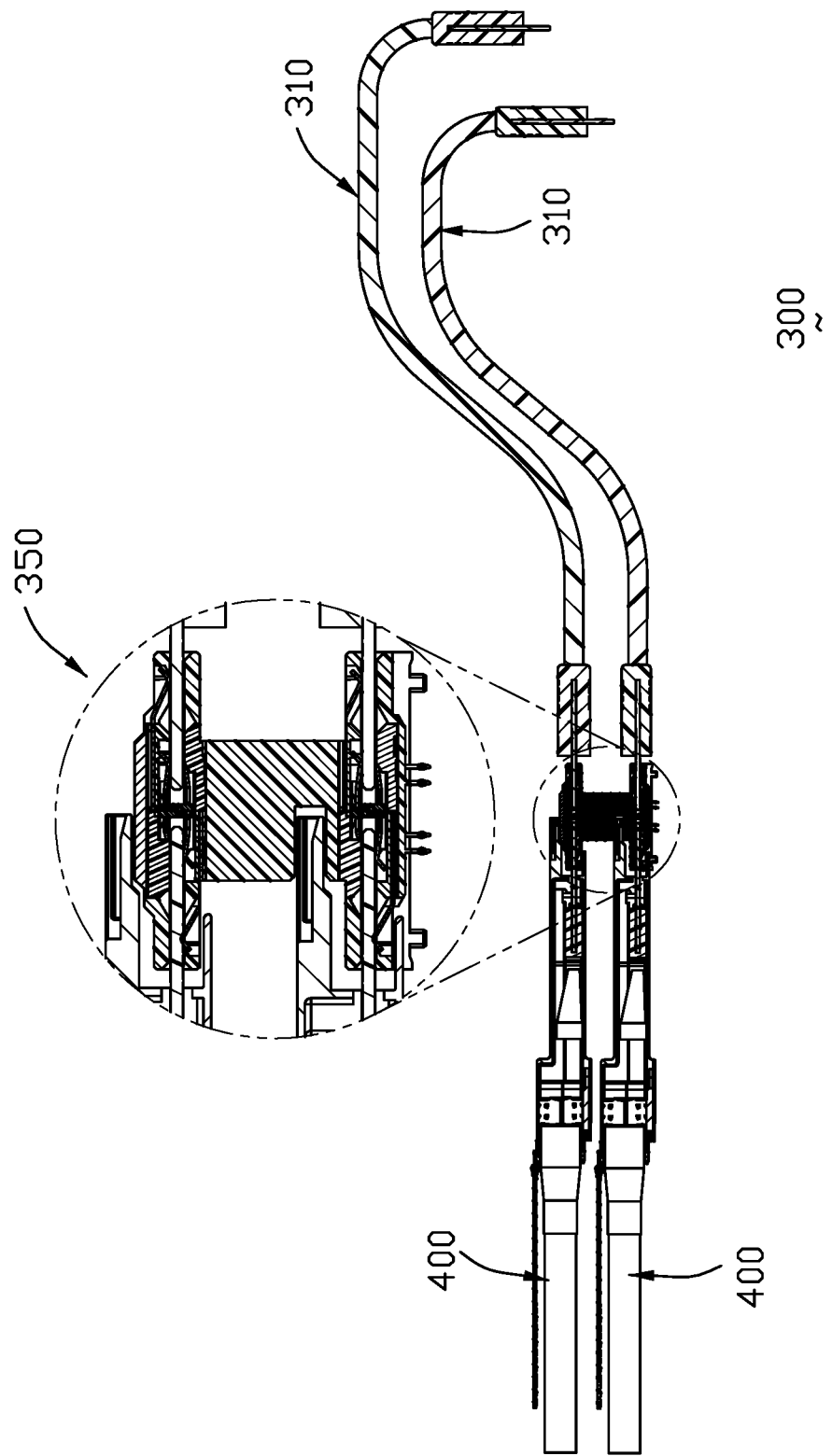
FIG. 17(B) is a cross-sectional view of the electrical system of FIG. 16(B)
Figure 17C:
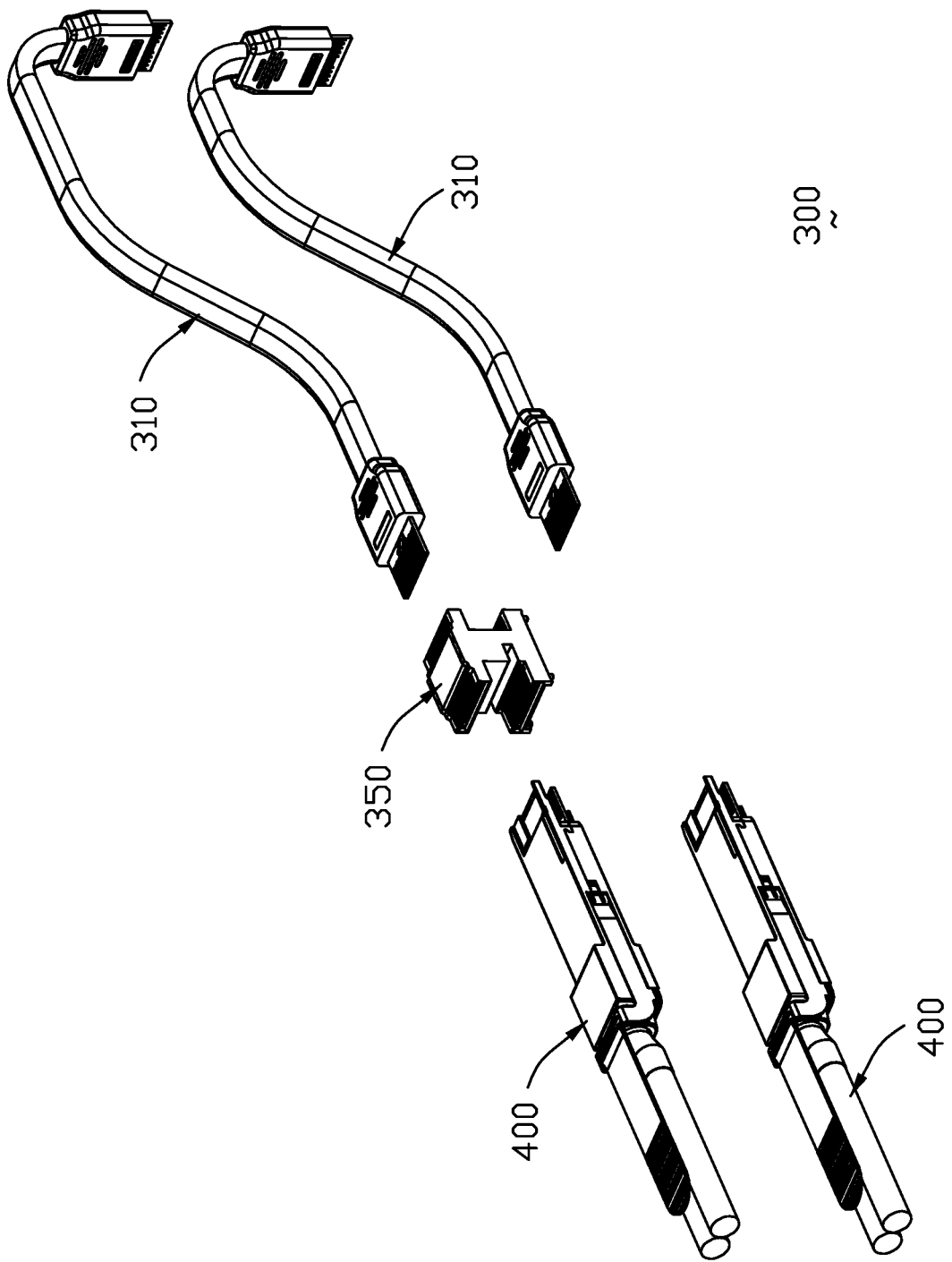
FIG. 17(C) is another exploded perspective view of the electrical system of FIG.17(A)
Figure 18:
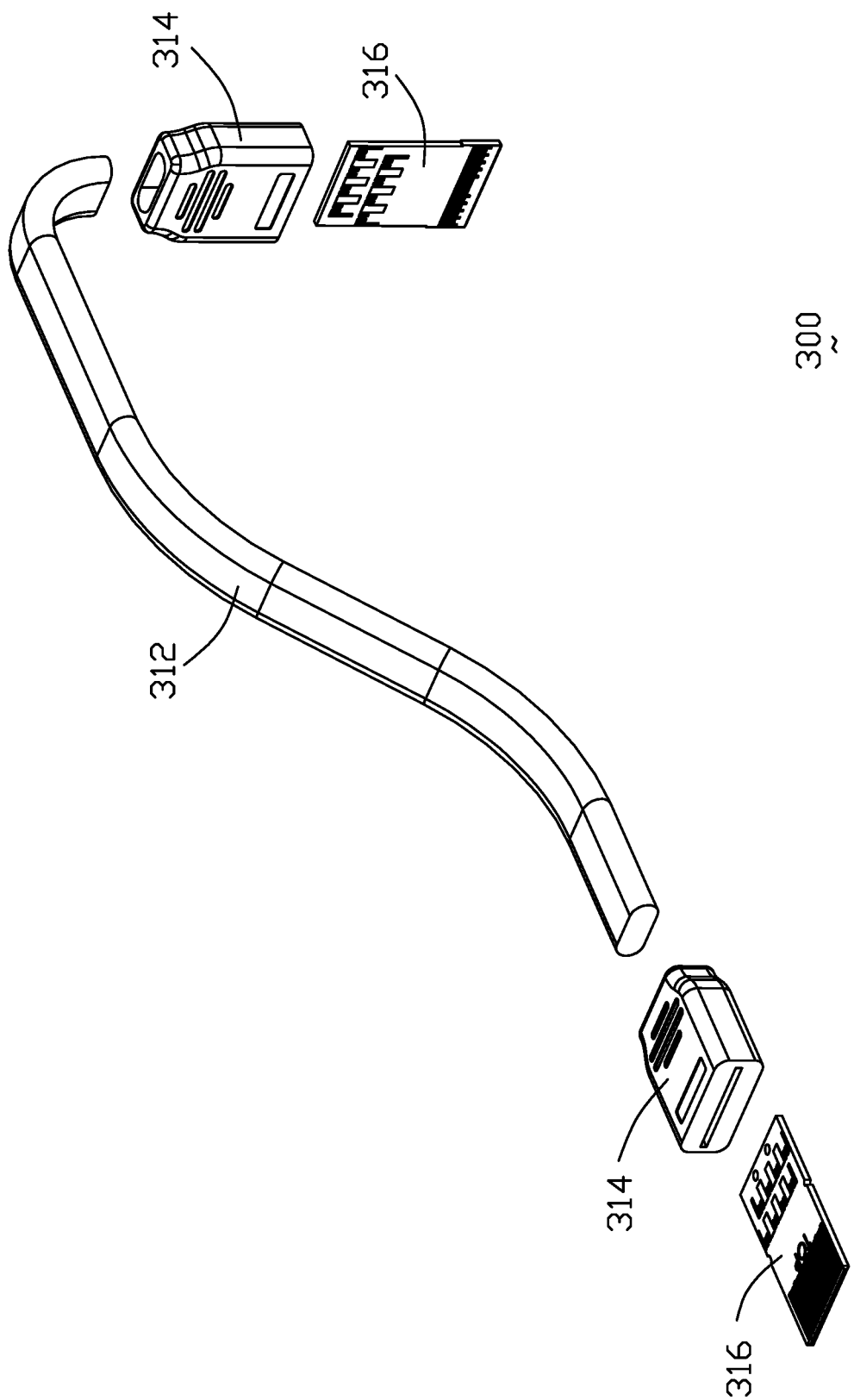
FIG. 18 is an exploded perspective view of the adaptor cable of the electrical system of FIG. 16(A)
Figure 19:
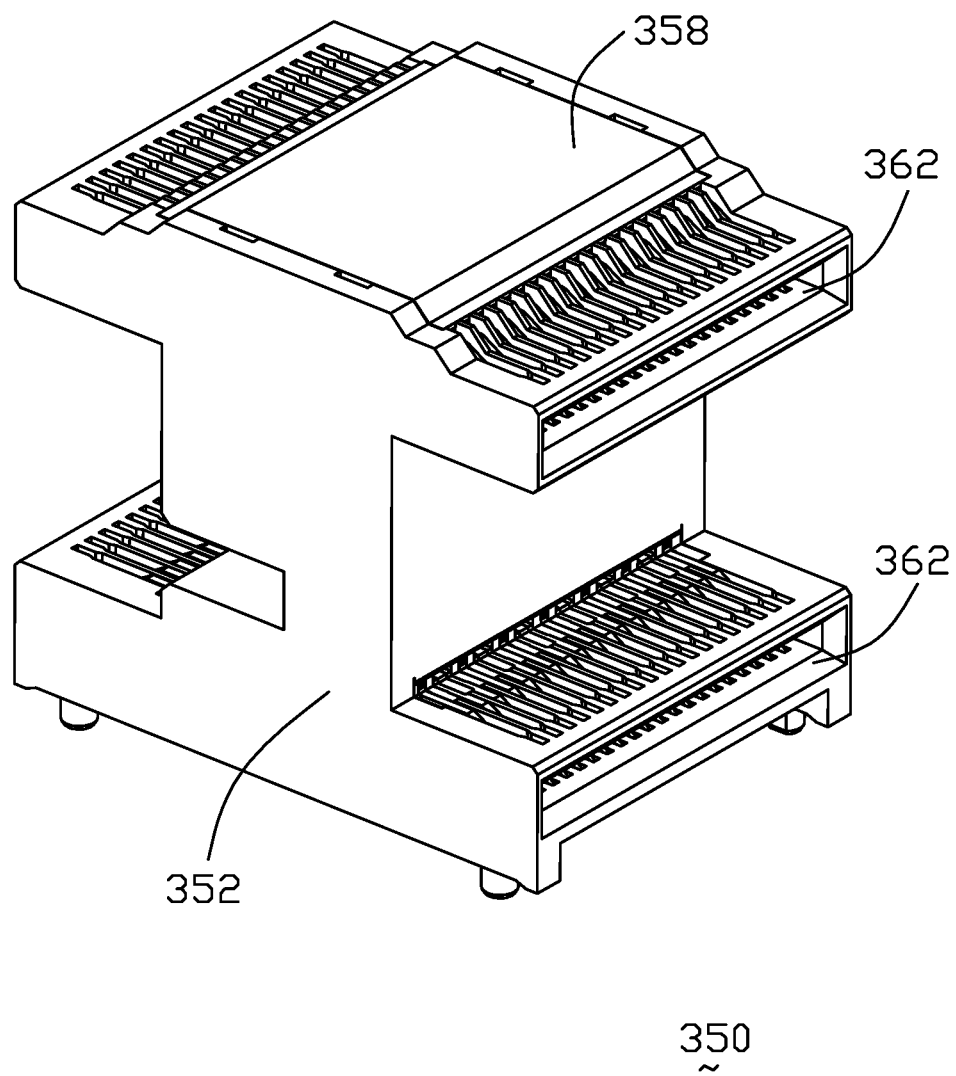
FIG. 19 is a stacked dual-sided receptacle connector of the electrical system of FIG. 16(A)
Figure 20:
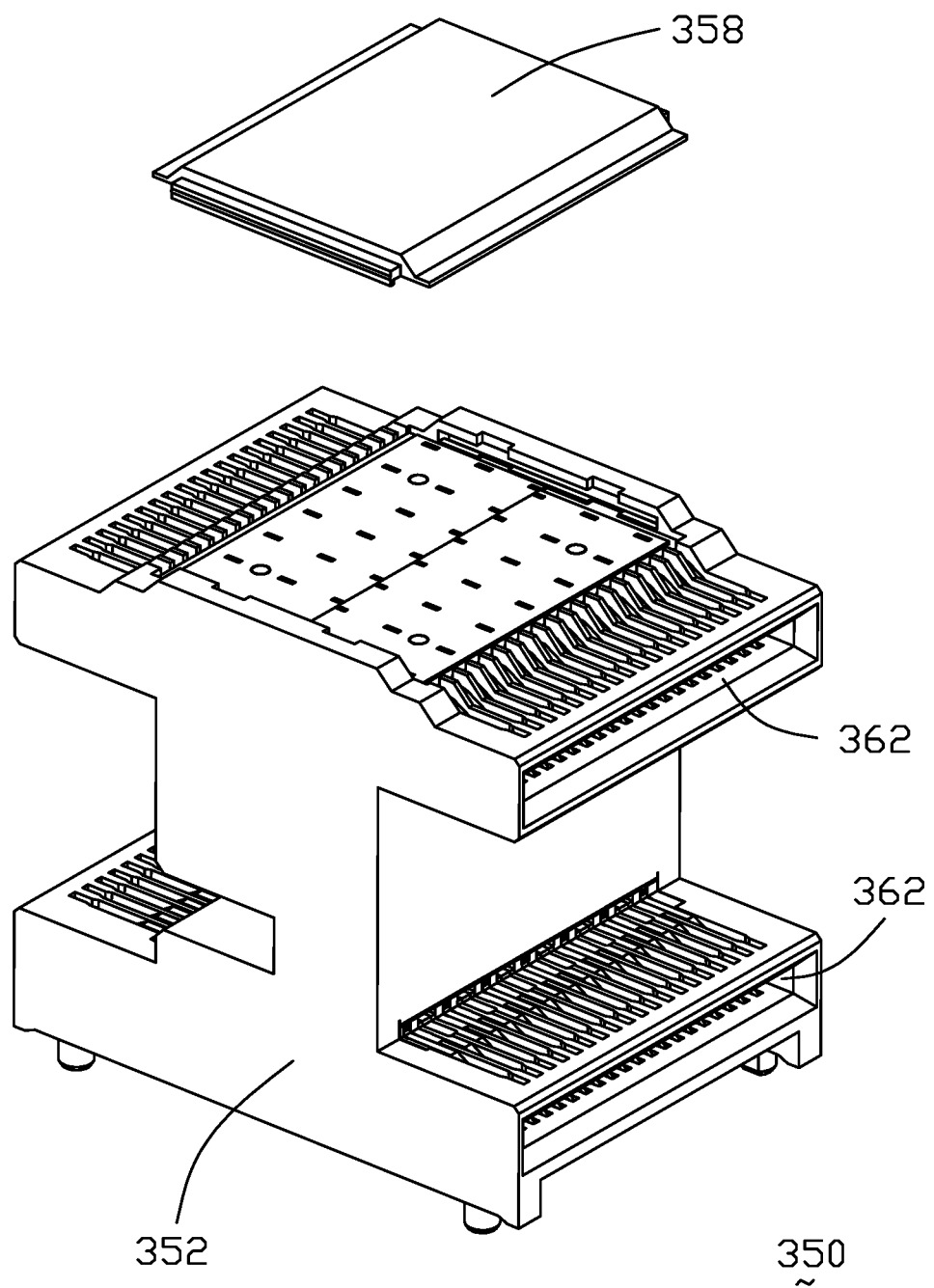
FIG. 20 is an exploded perspective view of the stacked dual-sided receptacle connector of the electrical system of FIG. 19.
Figure 21A:
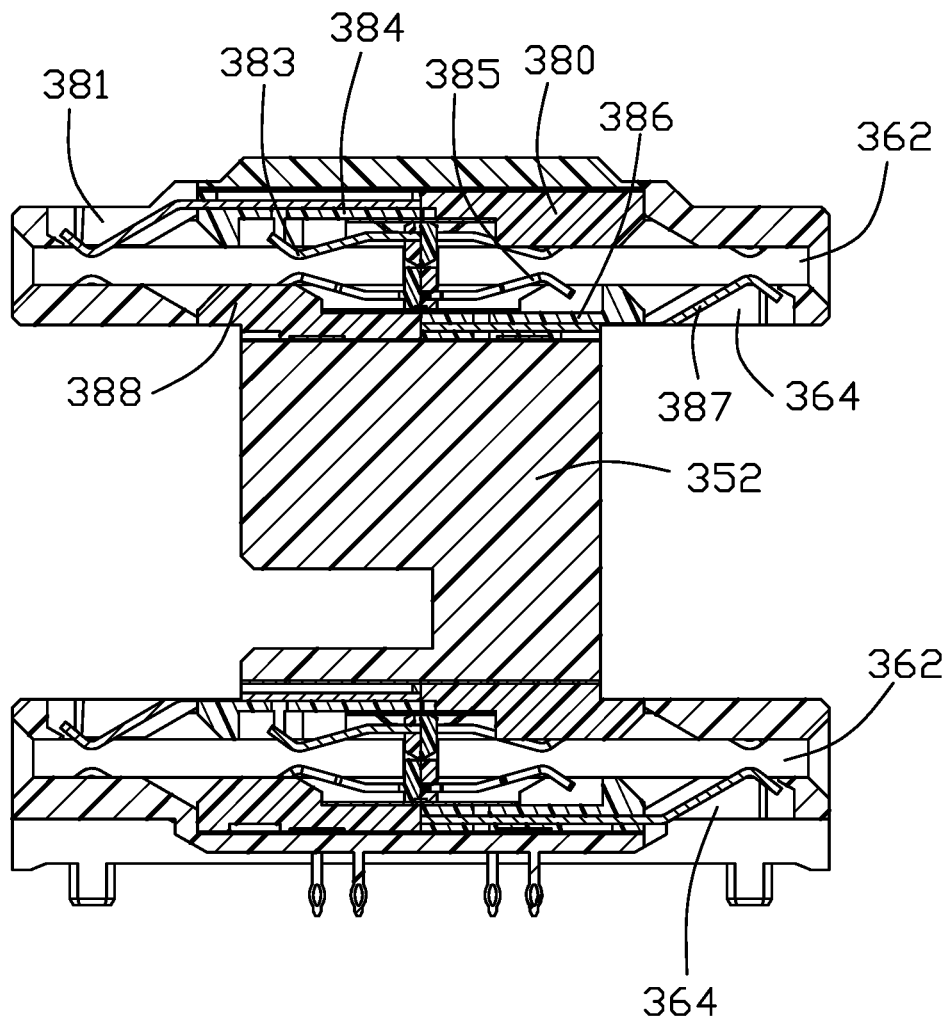
FIG. 21(A) is a cross-sectional view of the stacked dual-sided receptacle connector of the electrical system of FIG. 19.
Figure 21B:
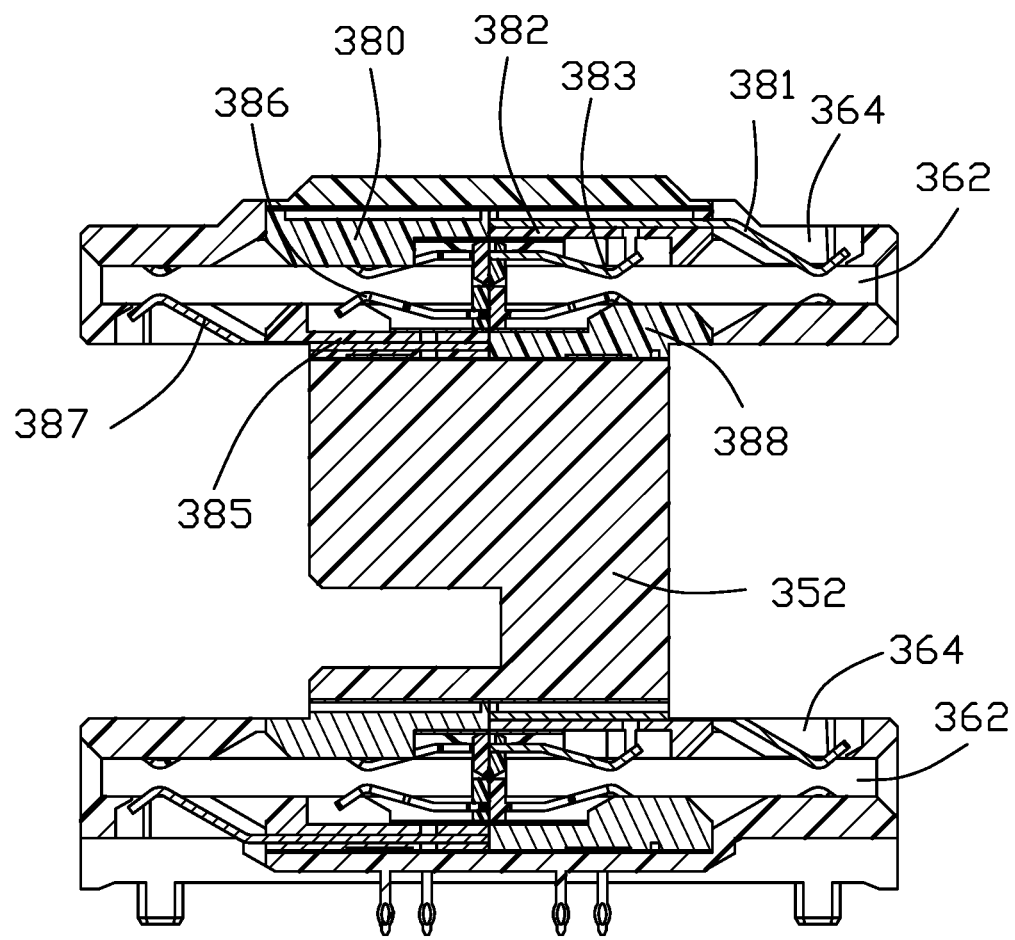
FIG. 21(B) is another cross-sectional view of the stacked dual-sided receptacle connector of the electrical system of FIG. 19.
Figure 22:
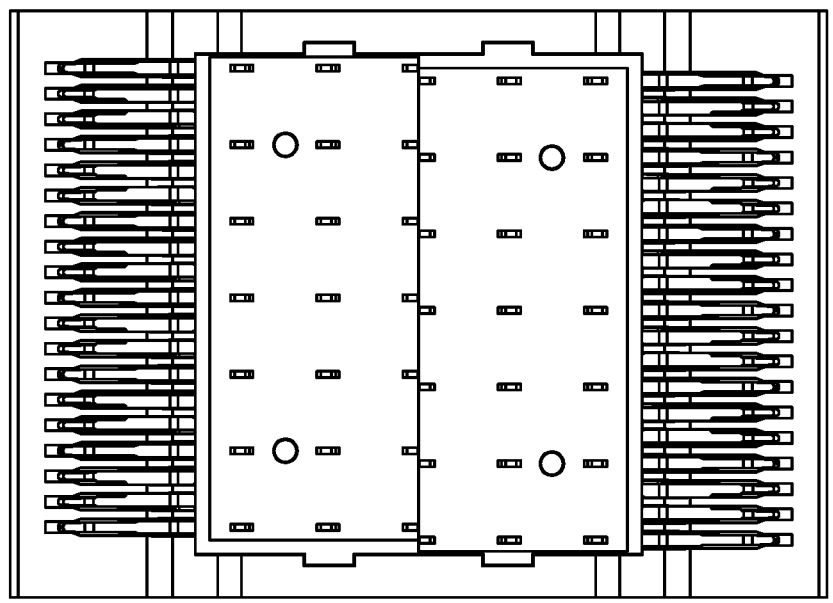
FIG. 22 is a top view of the stacked dual-sided receptacle connector of the electrical system of FIG. 19 by removing the top cover.
Figure 23A:
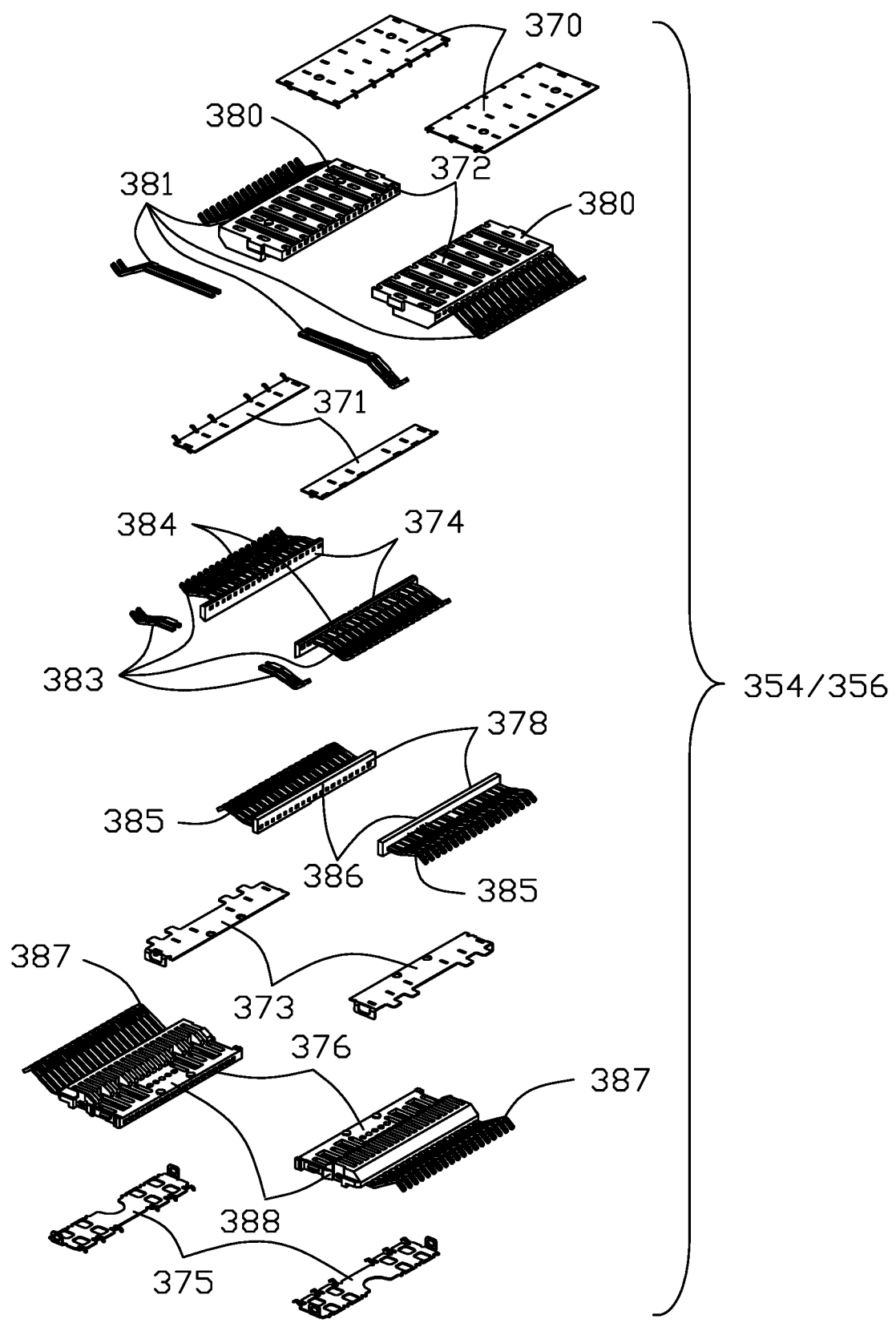
FIG. 23(A) is an exploded perspective view of the contact module of the stacked dual-sided receptacle connector of the electrical system of FIG. 19.
Figure 23B:
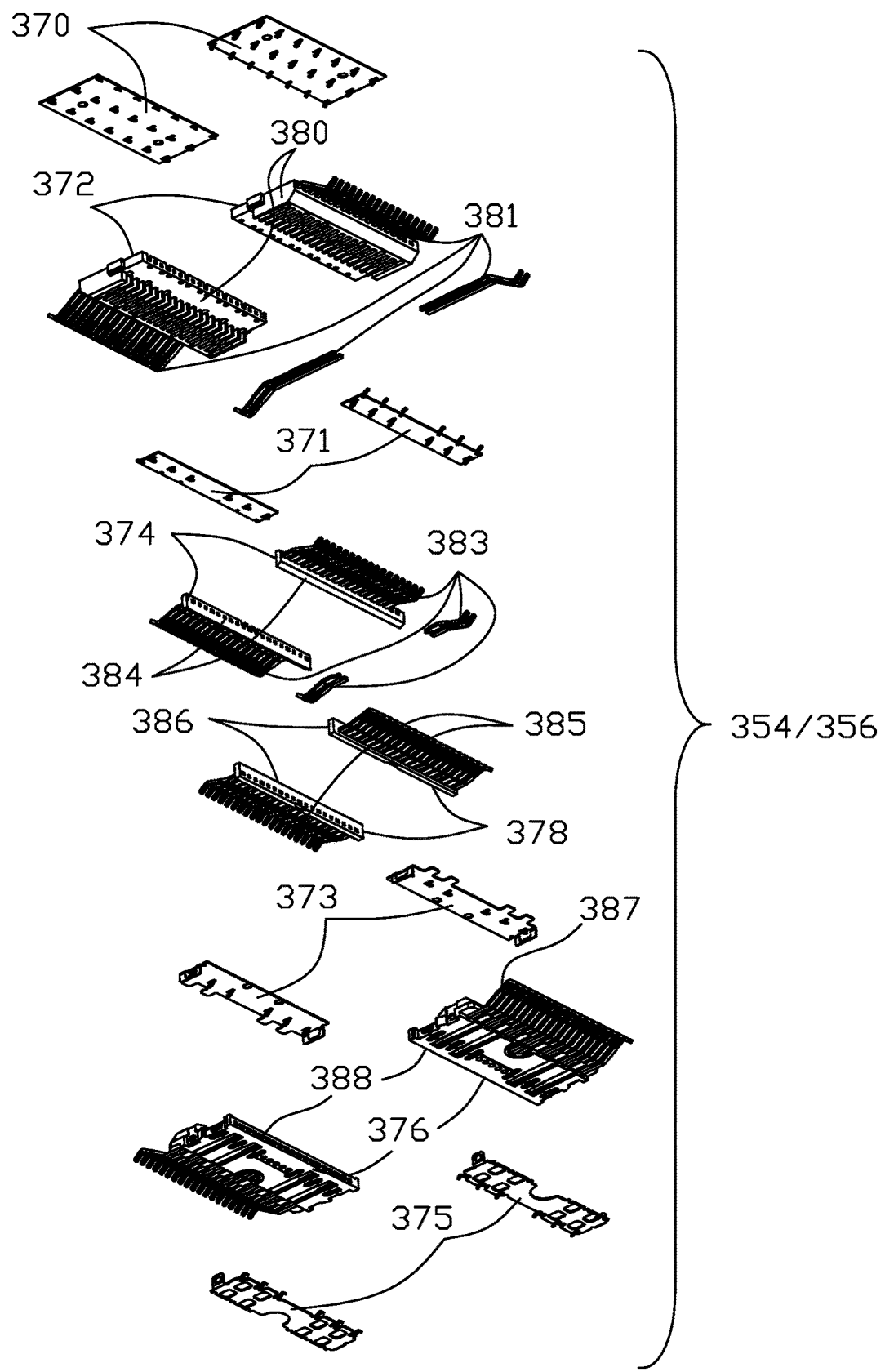
FIG. 23(B) is another exploded perspective view of the contact module of the stacked dual-sided receptacle connector of the electrical system of FIG. 23(A)
Figure 24A:
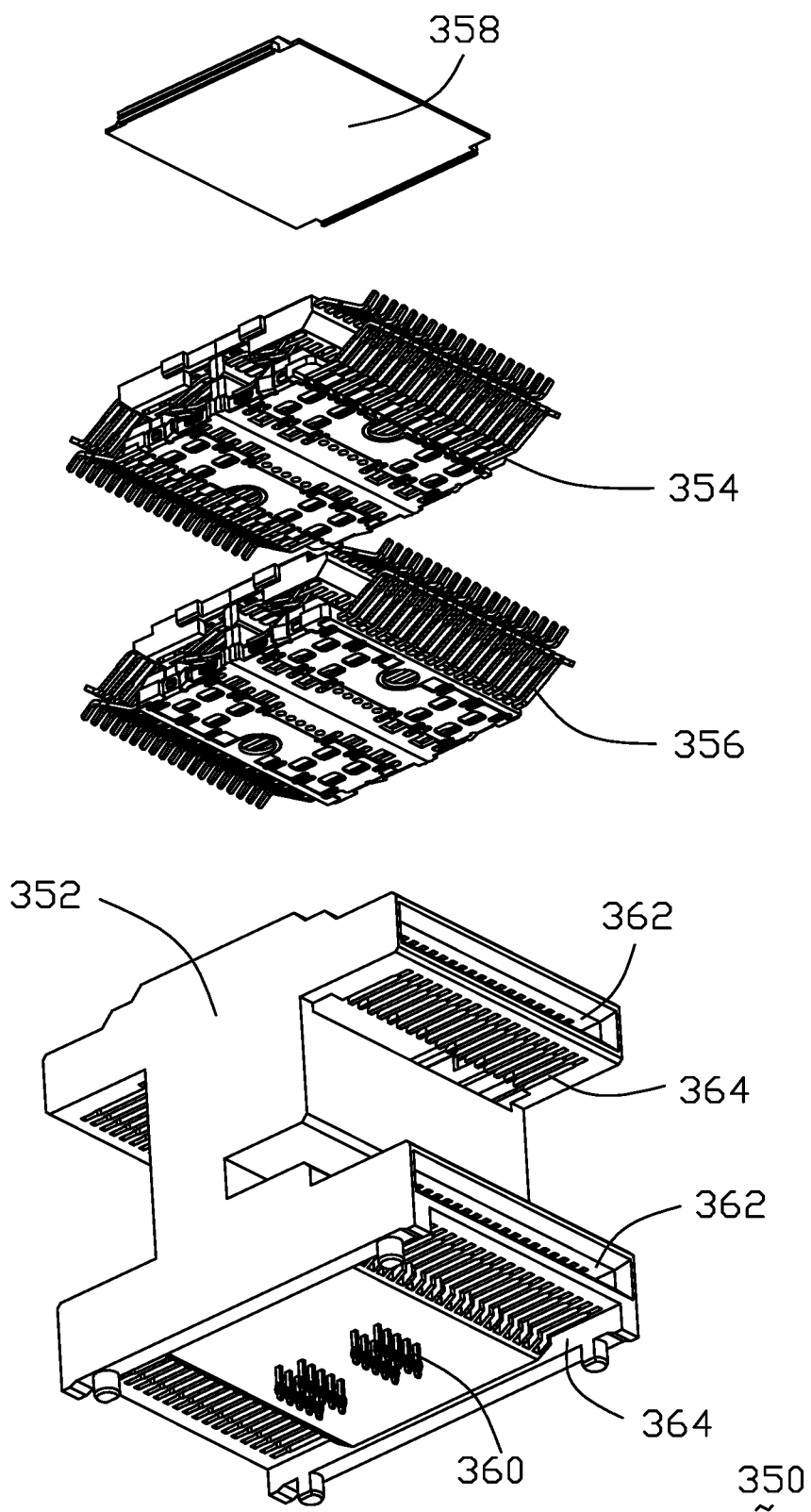
FIG. 24(A) is an exploded perspective view of the stacked dual-sided receptacle connector of the electrical system of FIG. 19.
Figure 24B:
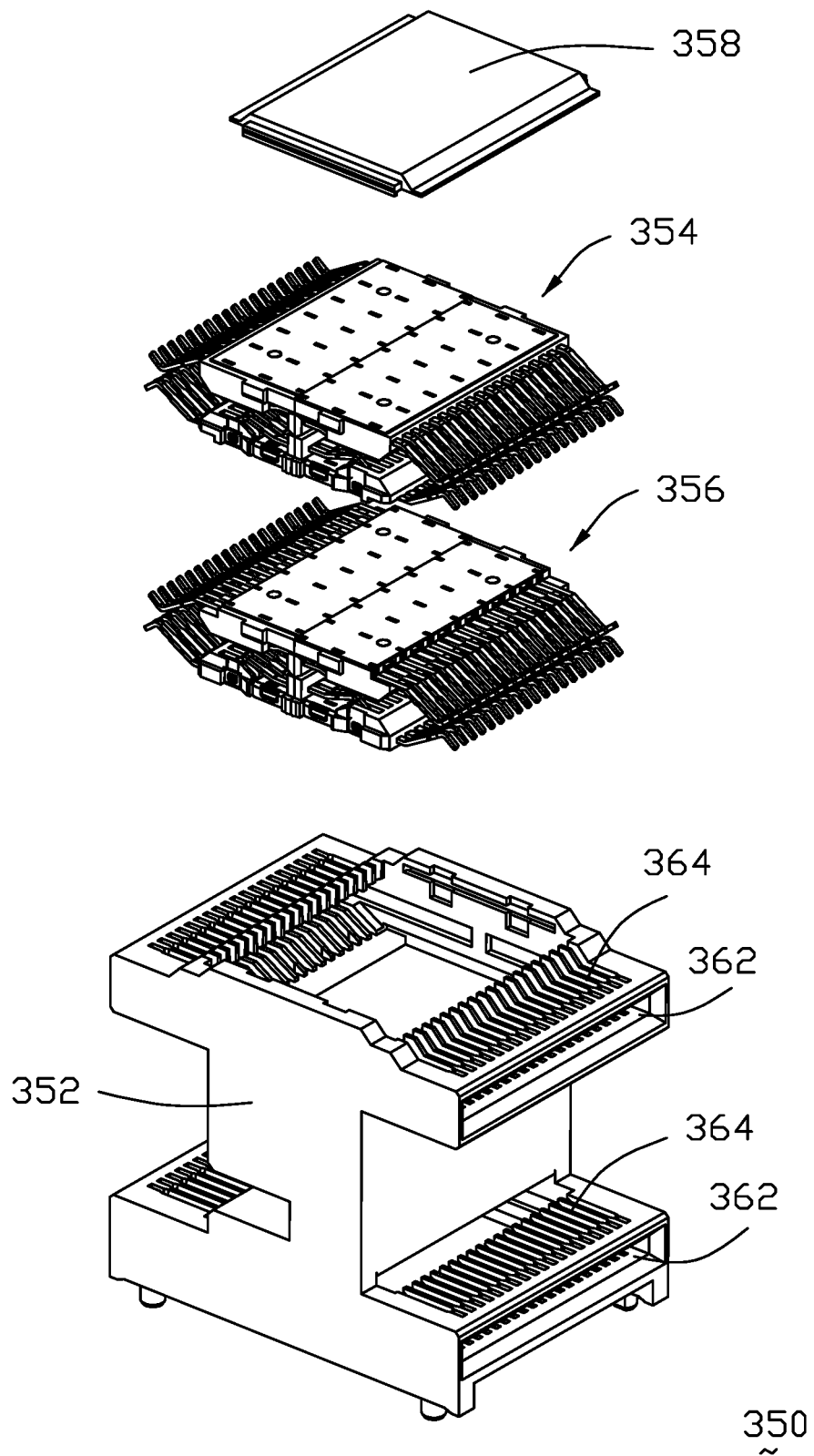
FIG. 24(B) is another exploded perspective view of the stacked dual-sided receptacle connector of the electrical system of FIG. 24(A)
Figure 25:
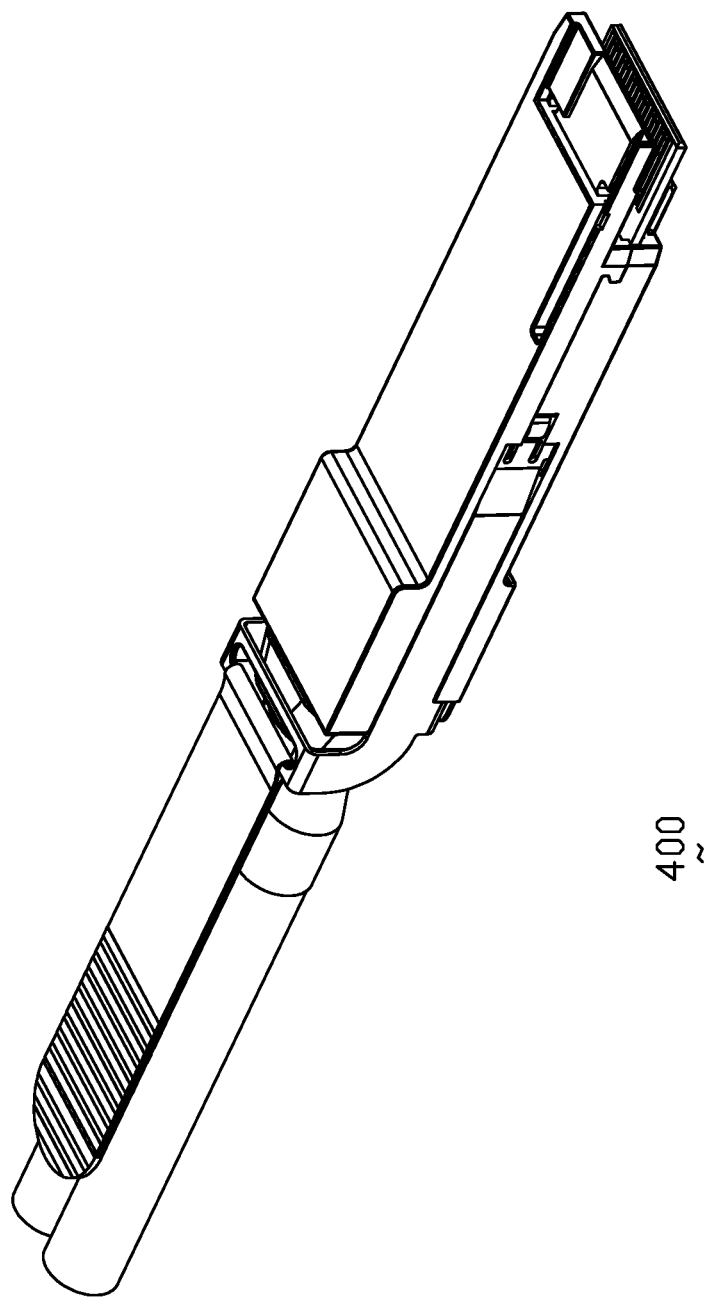
FIG. 25 is a perspective view of a QSFP-DD pluggable module of the electrical system of FIG. 16(A)
Figure 26:
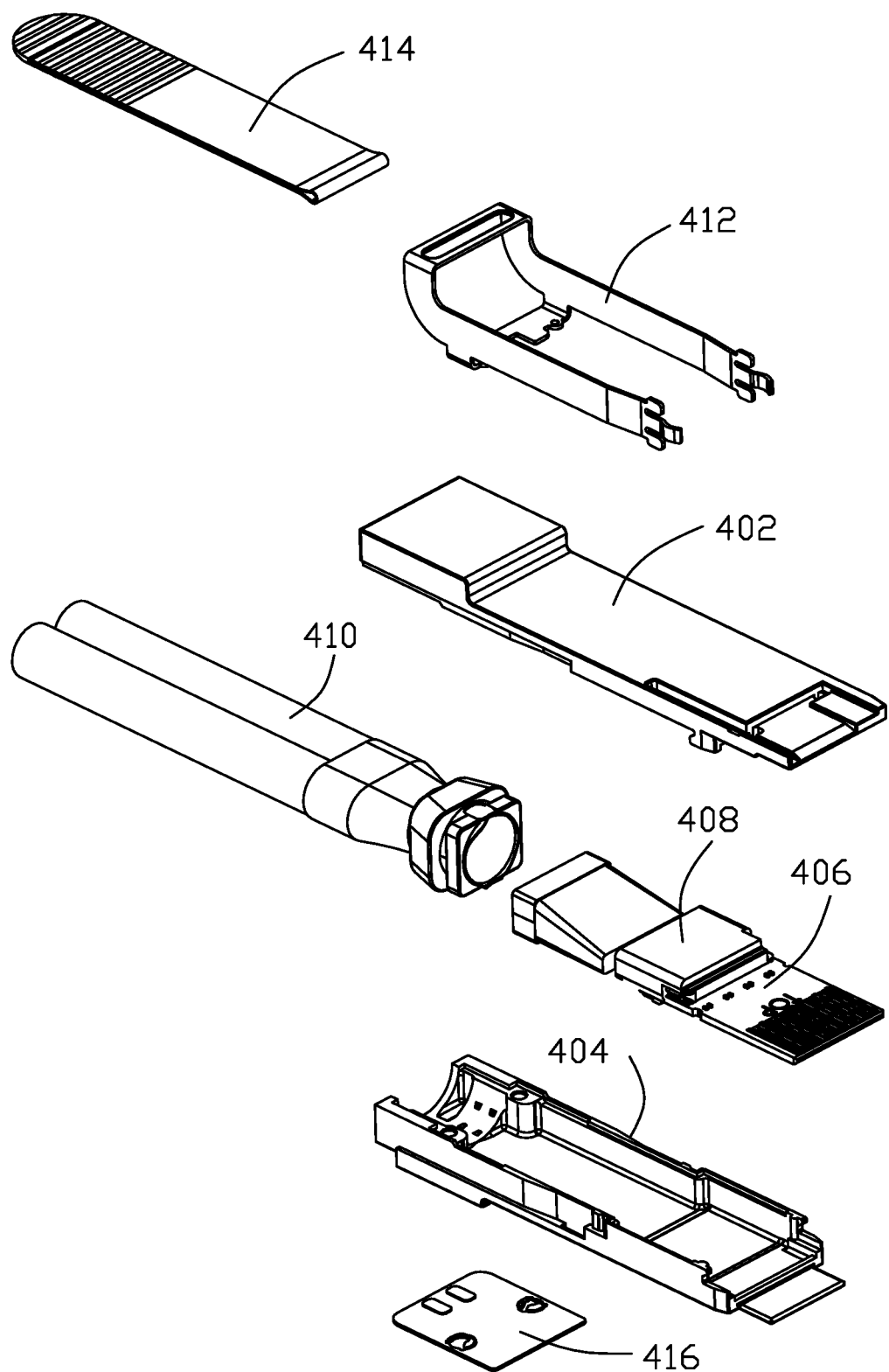
FIG. 26 is an exploded perspective view of the QSFP-DD pluggable module of the electrical system of FIG. 25.
Figure 27A:
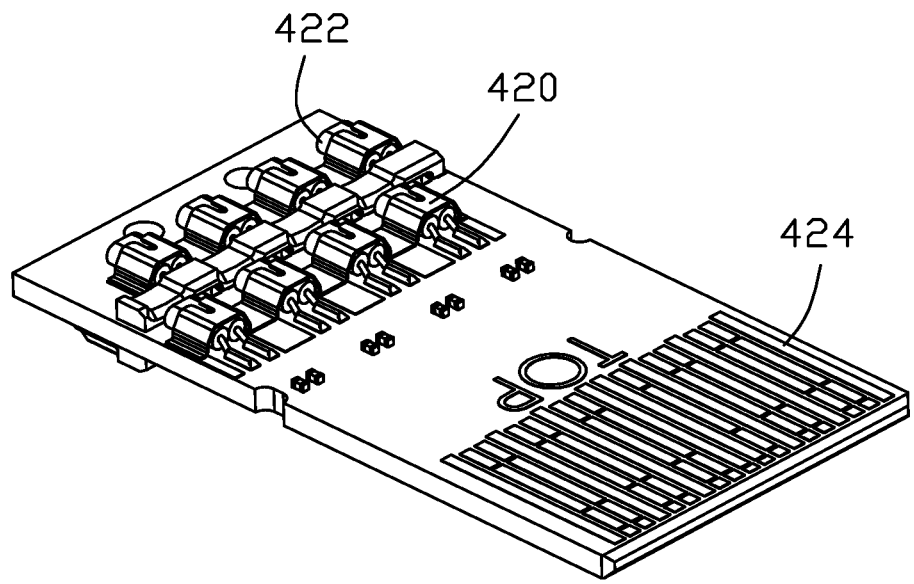
FIG. 27(A) is a top view of the paddle card of the QSFP-DD pluggable module of the electrical system of FIG. 25.
Figure 27B:
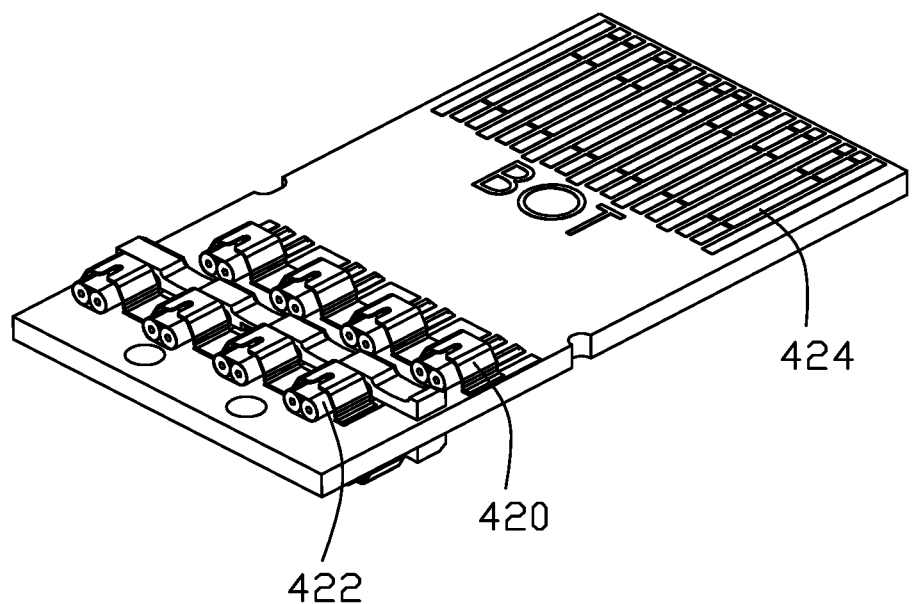
FIG. 27(B) is a bottom view of the paddle card of the QSFP-DD pluggable module of the electrical system of FIG. 25.

As shown in FIGS. 16(A)-27(B), an electrical system 300 according to another embodiment using the stacked dual-sided receptacle connector therewith. As shown in FIG. 17(A)-17(C), the electrical system 300 includes a pair of QSFP-DD pluggable modules 400 electrically connected to a pair of adaptor cables assemblies 310 via a stacked dual-sided receptacle connector or extender or adaptor 350. Notably, the QSFP-DD pluggable module 400 is mated with an outer (side) port of the dual-sided receptacle connector 350, and the adaptor cable assembly 310 is mated with an inner (side) port of the dual-sided receptacle connector 350. As shown in FIG. 18, the adaptor cable assembly 310 includes a cable 312 with at an inner end, an inner connector composed of a mating board 316, which is essentially of an FP5 plug board interface for mating with the vertical receptacle connector 1010, retained in the insulative holder 314, and at an outer end, an outer connector composed of a mating board 316, which is essentially of a QSFP-DD plug board interface for being received within the inner (side) port of the dual-sided receptacle connector 350, retained by the insulative holder 314.

As shown in FIGS. 19-24(B), the stacked dual-sided receptacle connector 350 includes an insulative housing 352 with corresponding cavities (not labeled) to receive the corresponding upper contact module 354 and lower contact module 356, respectively. The insulative housing 352 forms opposite inner receiving slot and outer receiving slot 362 in both of the lower floor/level and upper floor/level. Each contact module 354/356 includes a pair of inner/outer large upper parts 372 associated with a pair of inner/outer small upper parts 374 with a pair of inner/outer upper grounding sheets 371 therebetween, and a pair of inner/outer large lower parts 376 associated with a pair of inner/outer small lower parts 378 with a pair of inner/outer lower grounding sheets 373 therebetween. The large upper part 372 is composed of the large upper insulator 380 and the large upper contacts 381, the small upper part 374 is composed of the small upper insulator 384 and small upper contacts 383, the large lower part 376 is composed of the large lower insulator 388 and the large lower contacts 387, and the small lower part 378 is composed of the small lower insulator 386 and the small lower contacts 385. Similar to the first embodiment, the (inner) large upper contacts 381 and the (outer) large upper contacts 381 are electrically connected, and the small upper contacts 383, the large lower contacts 387 and the small lower contact 385 are as well in the same pattern so as to transmit the signals between the external QSFP pluggable module 400 and the internal adaptor cable assembly 310. Understandably, in an alternate embodiment, the inner large upper contact 381 and the corresponding outer large upper contact can be unified together as one piece, and the corresponding small upper contacts, 383, the large lower contacts 387 and the small lower contacts 385 can be done as well.

Notably, during mating, the mating board of either the QSFP-DD pluggable module 400 is sandwiched between the associated (outer) large upper part 372/small upper part 374 and the associated (outer) large lower part 376/small lower part 378 in the vertical direction. Similarly, the mating board of the adaptor cable assembly 310 is sandwiched between the associated (inner) large upper part 372/small upper part 374 and the associated (inner) large lower part 376/small lower part 378 in the vertical direction.

The top metallic top cover 370 is attached upon the upper face of the upper contact module 354, and the metallic bottom cover 375 is attached upon the bottom face of the lower contact module 356. The insulative housing 352 further forms a plurality of passageways 364 for allowing deflection of the corresponding contacts. Similar to the first embodiment, an insulative top cover 358 is attached upon the top face of the housing 352, and the conductive connecting legs/tails 360 are further electrically connected to the corresponding contacts around the center region of the dual-sided receptacle connector 350 for optional low speed signal transmission.

As shown in FIGS. 25-27(B), similar to the FP5 pluggable module 900 disclosed in the first embodiment, the QSFP-DD pluggable module 400 includes a metallic top cover 402, a metallic bottom cover 404 commonly defining an interior space to receive a paddle card 406 and the associated inner insulator 408. A releasing bar 412 and a pull tape 414 are attached upon the top cover 402 and the bottom cover 404. A cable 410 is connected to the paddle card 406, and a metallic cover 416 is attached upon the bottom cover 404. The paddle card 406 includes a front mating pads 424, and a plurality of securing bracket 420 to hold the respective wire 422 of the cable 410 in position.

What is claimed is:

1. A dual-sided receptacle connector adapted for being mounted on a printed circuit board, comprising:
   an insulative housing defining a pair of inner ports and a pair of outer ports opposite to each other along a front-to-back direction; and
   a lower contact module and an upper contact module received in the insulative housing; wherein
   each of the contact modules comprises a plurality of outer mating portions received in a corresponding outer port and a plurality of inner mating portions received in the inner port, the lower contact module includes at least one tail for being mounted to the printed circuit board, and all of the inner mating portions and the at least one tail of the lower contact module are electrically connected with the outer mating portions of the lower contact module, respectively; and the pair of inner ports are spaced apart from each other along a vertical direction and the pair of outer ports are spaced apart from each other along the vertical direction.

2. The dual-sided receptacle connector as claimed in claim 1, wherein each of the inner mating portions is unified together as one piece with corresponding one of the outer mating portions.

3. The dual-sided receptacle connector as claimed in claim 1, wherein the inner mating portions and the outer mating portions extend along a first direction, and the at least one tail extends along a second direction perpendicular to the first direction.

4. The dual-sided receptacle connector as claimed in claim 1, wherein each contact module includes an outer large upper part associated with an outer small upper part, and an outer large lower part associated with an outer small lower part.

5. The dual-sided receptacle connector as claimed in claim 4, further comprising an outer upper grounding sheet disposed between the outer large upper part and the outer small upper part, and an outer lower grounding disposed between the outer large lower part and the outer small lower part.

6. The dual-sided receptacle connector as claimed in claim 4, wherein each contact module includes an inner large upper part associated with an inner small upper part, and an inner large lower part associated with an inner small lower part.

7. The dual-sided receptacle connector as claimed in claim 6, further comprising an inner upper grounding sheet disposed between the inner large upper part and the inner small upper part, and an inner lower grounding sheet disposed between the inner large lower part and the inner small lower part.

8. The dual-sided receptacle connector as claimed in claim 6, further comprising a metallic top cover attached on an upper face of the outer large upper part and the inner large upper part of the upper contact module.

9. The dual-sided receptacle connector as claimed in claim 6, further comprising a metallic bottom cover attached on a bottom face of the outer large lower part and the inner large lower part of the lower contact module.

10. The dual-sided receptacle connector as claimed in claim 1, wherein each contact module includes:

an inner large upper part associated with an inner small upper part with an inner upper grounding sheet therebetween and commonly exposed at an upper level of the inner port;

an outer large upper part associated with an outer small upper part with an outer upper grounding sheet therebetween and commonly exposed at the upper level of the outer port;

an inner large lower part associated with an inner small lower part with an inner lower grounding sheet therebetween and commonly exposed at a lower level of the inner port;

an outer large lower part associated with an outer small lower part with an outer lower grounding sheet therebetween and commonly exposed at the lower level of the outer port; wherein each of said inner large upper part, said inner small upper part, said outer large upper part, said outer small upper part, said inner large lower part, said inner small lower part, said outer large lower part and said outer small lower part has corresponding contacts, and the contacts of the inner large upper part and those of the outer large upper part are connected with each other, respectively, the contacts of the inner small upper part and those of the outer small upper part are connected with each other, respectively, the contacts of the inner large lower part and those of the outer large lower part are connected with each other, respectively, and the contacts of the inner small lower part and those of the outer small lower part are connected with each other, respectively.

11. A dual-sided receptacle connector comprising:

an insulative housing defining an inner port and an outer port opposite to each other along a front-to-back direction;

a contact module disposed in the housing and including:

an inner large upper parts associated with an inner small upper parts with an inner upper grounding sheet therebetween and commonly exposed at an upper level of the inner port;

an outer large upper part associated with an outer small upper part with an outer upper grounding sheet therebetween and commonly exposed at the upper level of the outer port;

an inner large lower part associated with an inner small lower part with an inner lower grounding sheet therebetween and commonly exposed at a lower level of the inner port;

an outer large lower part associated with an outer small lower part with an outer lower grounding sheet therebetween and commonly exposed at the lower of the outer port; wherein each of said inner large upper part, said inner small upper part, said outer large upper part, said outer small upper part, said inner large lower part, said inner small lower part, said outer large lower part and said outer small lower part has the corresponding contacts, and the contacts of the inner large upper part and those of the outer large upper part are connected with each other, respectively, the contacts of the inner small upper part and those of the outer small upper part are connected with each other, respectively, the contacts of the inner large lower part and those of the outer large lower part are connected with each other, respectively, and the contacts of the inner small lower part and those of the outer small lower part are connected with each other, respectively; wherein the housing forms a plurality of passageways to receive the corresponding contacts, and the passageways are upwardly open so as to allow the contact module to be downwardly assembled into the housing.

* * * * *